(12) United States Patent
Yoo et al.

(10) Patent No.: US 9,709,215 B2
(45) Date of Patent: Jul. 18, 2017

(54) WALL MOUNT PLATE OF DISPLAY APPARATUS AND DISPLAY APPARATUS

(71) Applicant: SAMSUNG ELECTRONICS CO., LTD., Suwon-si, Gyeonggi-do (KR)

(72) Inventors: Jun-Mo Yoo, Yongin-si (KR); Joon Seok Ahn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 14/924,822

(22) Filed: Oct. 28, 2015

(65) Prior Publication Data

US 2016/0348832 A1 Dec. 1, 2016

(30) Foreign Application Priority Data

Jun. 1, 2015 (KR) .................. 10-2015-0077196

(51) Int. Cl.
| | | |
|---|---|---|
| F16M 13/02 | (2006.01) | |
| A47B 97/00 | (2006.01) | |
| F16B 1/00 | (2006.01) | |
| H05K 7/14 | (2006.01) | |

(52) U.S. Cl.
CPC ........... F16M 13/02 (2013.01); A47B 97/001 (2013.01); F16B 1/00 (2013.01); F16M 13/022 (2013.01); H05K 7/14 (2013.01); A47B 2097/005 (2013.01); F16B 2001/0035 (2013.01)

(58) Field of Classification Search
CPC combination set(s) only.
See application file for complete search history.

(56) References Cited

U.S. PATENT DOCUMENTS

| | | | | |
|---|---|---|---|---|
| 6,374,523 B1* | 4/2002 | Smith | ...................... | G09F 7/02 40/594 |
| 7,097,143 B2* | 8/2006 | Kim | ...................... | F16M 11/041 248/201 |
| 7,589,959 B2* | 9/2009 | Ikeda | ...................... | G06F 1/1601 248/917 |
| 7,848,090 B2* | 12/2010 | Ikeda | ...................... | G06F 1/1601 361/679.21 |
| 8,347,536 B2* | 1/2013 | Sadowski | ............... | G09F 11/02 40/376 |
| 8,411,426 B2* | 4/2013 | Ikeda | ...................... | G06F 1/1601 361/679.21 |
| 8,464,447 B2* | 6/2013 | Pemberton | ................ | G09F 7/04 40/568 |
| 9,091,386 B2* | 7/2015 | Bentz | .................... | G06F 1/1632 |

(Continued)

FOREIGN PATENT DOCUMENTS

| | | |
|---|---|---|
| CN | 202613002 | 12/2012 |
| EP | 2 423 561 | 2/2012 |

(Continued)

*Primary Examiner* — Lisa Lea Edmonds
(74) *Attorney, Agent, or Firm* — Nixon & Vanderhye P.C.

(57) ABSTRACT

A wall mount plate for a display apparatus is disclosed. For example, a wall mount plate for a display apparatus configured to fix the display apparatus onto a wall by use of magnetic force of a magnet is disclosed. Some of the disclosed examples are provided with the wall mount plate having a recess accommodating a magnet and configured to fix the display apparatus onto a wall by use of magnetic force of the magnet.

22 Claims, 14 Drawing Sheets

(56) References Cited

U.S. PATENT DOCUMENTS

| | | | | |
|---|---|---|---|---|
| 2006/0237604 A1* | 10/2006 | Tan | ..................... | B60R 11/0235 248/205.3 |
| 2007/0247800 A1* | 10/2007 | Smith | ................. | B60R 11/0252 361/679.02 |
| 2008/0001048 A1* | 1/2008 | Woo | ....................... | F16M 11/10 248/276.1 |
| 2009/0066652 A1* | 3/2009 | Verstraelen | ........ | G08B 13/1427 345/168 |
| 2010/0133409 A1* | 6/2010 | Park | ........................ | A47G 1/18 248/470 |
| 2012/0320506 A1* | 12/2012 | Bentz | .................... | G06F 1/1632 361/679.01 |
| 2013/0159583 A1* | 6/2013 | Struthers | ................ | H04H 20/63 710/303 |
| 2013/0321715 A1* | 12/2013 | Millson | ................ | F16M 11/048 348/739 |
| 2016/0003270 A1* | 1/2016 | Franklin | ................... | F16B 1/00 439/529 |
| 2016/0065803 A1* | 3/2016 | Williams | ............... | H04N 5/645 40/780 |
| 2016/0246328 A1* | 8/2016 | Christie, II | ........... | G06F 1/1632 |

FOREIGN PATENT DOCUMENTS

| | | |
|---|---|---|
| JP | 2013-130645 | 7/2013 |
| JP | 2013-148925 | 8/2013 |
| KR | 10-2008-0019483 | 3/2008 |
| KR | 10-2010-0124451 | 11/2010 |
| KR | 10-2012-0124338 | 10/2013 |
| KR | 10-2014-0104836 | 8/2014 |

\* cited by examiner

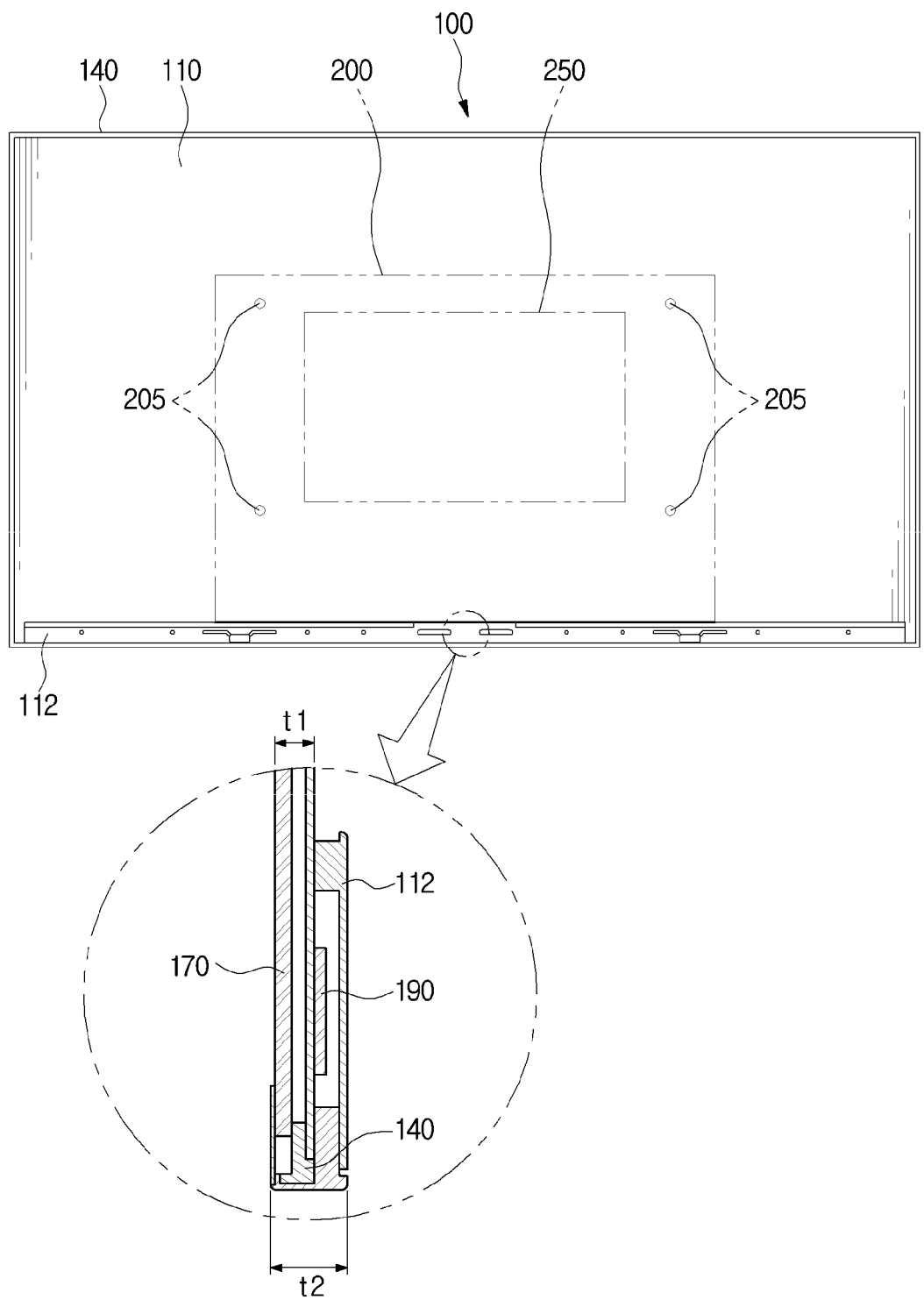

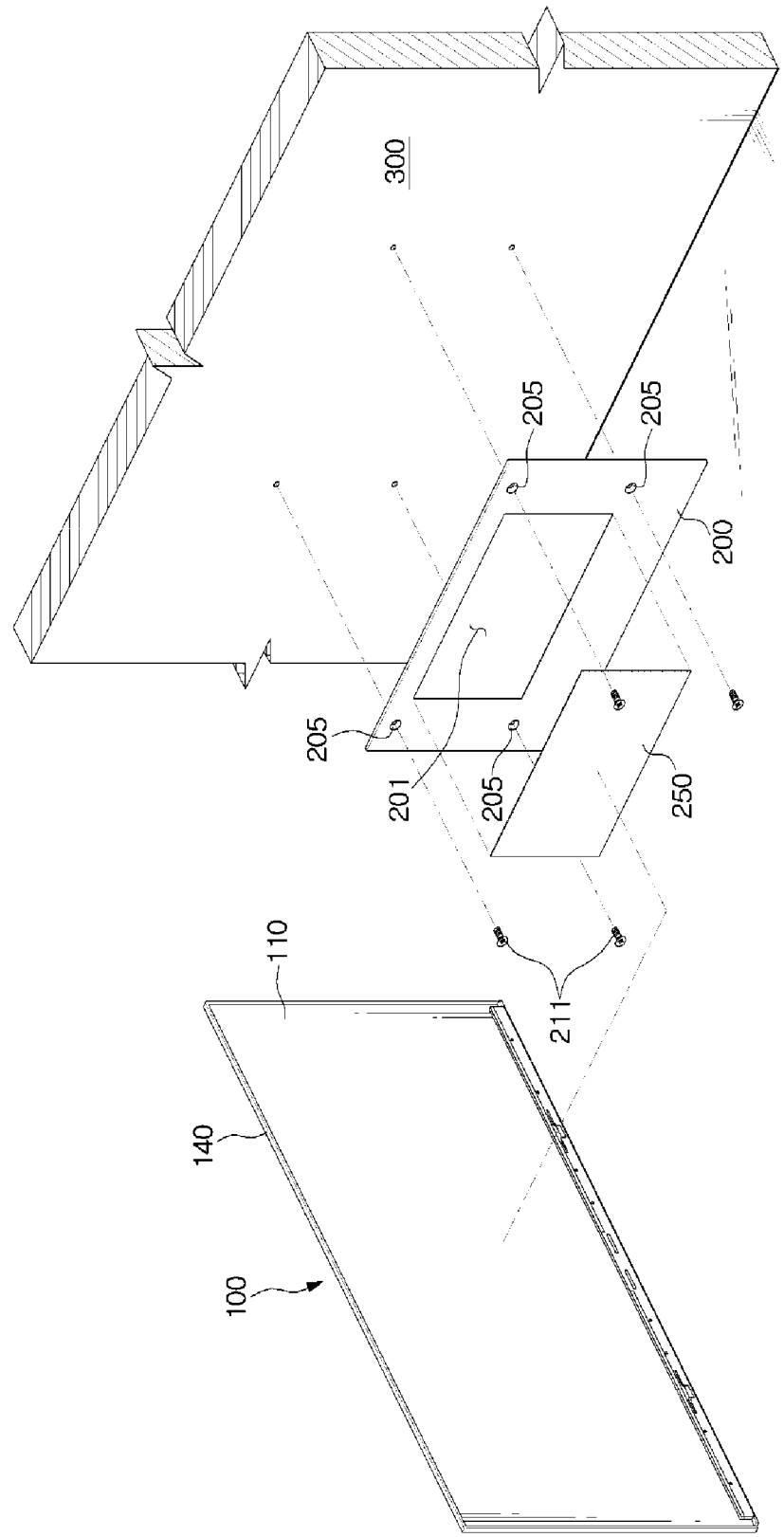

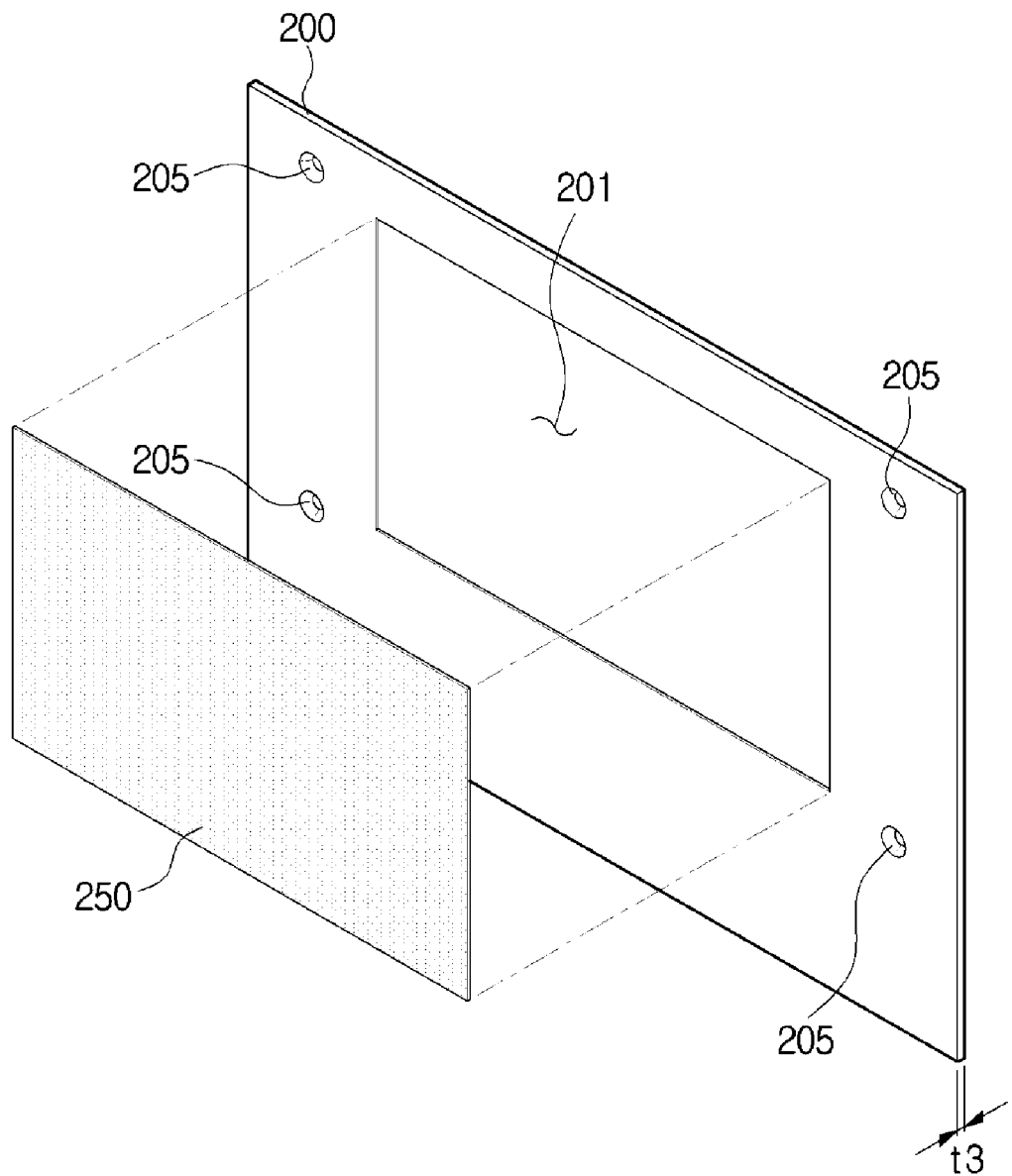

WALL MOUNT PLATE OF DISPLAY APPARATUS AND DISPLAY APPARATUS

CROSS-REFERENCE TO RELATED APPLICATION

This application is based on and claims priority under 35 U.S.C. §119 to Korean Patent Application No. 10-2015-0077196, filed on Jun. 1, 2015, in the Korean Intellectual Property Office, the disclosure of which is incorporated by reference herein in its entirety.

BACKGROUND

1. Field

Examples of the disclosure relate to a wall mount plate of a display apparatus, for example, a wall mount plate to fix a display apparatus onto a wall.

2. Description of Related Art

A display panel showing contents on a display apparatus is recently provided with high resolution and in larger size. The thickness of the display apparatus is becoming increasingly smaller and the weight of the display apparatus is also becoming increasingly lighter. In addition, fixing the thinner and lighter display apparatus onto a wall is becoming increasingly desirable.

A wall mount bracket is used to fix the display apparatus onto a wall. In a case when fixing the display apparatus onto a wall using the wall mount bracket, the display apparatus is generally spaced away from wall by, for example, as much as the thickness of the wall mount bracket.

SUMMARY

Additional aspects of the disclosure will be set forth in part in the description which follows.

In accordance with an example of the disclosure, a wall mount plate provided for a display apparatus includes a rear surface configured to make contact with a wall and including a recess to accommodate a magnet, and may be provided to make contact with a bottom chassis of the display apparatus by use of magnetic force of the magnet.

In accordance with an example of the disclosure, a lower end of the wall mount plate may make contact with an upper end of a rear cover of the display apparatus.

In accordance with an example of the disclosure, a central point of the recess and a central point of the wall mount plate may be different.

In accordance with an example of the disclosure, the wall mount plate may further include a hole through which a coupling member disposed, and may be fixed onto the wall by use of the coupling member penetrating through the hole.

In accordance with another example of the disclosure, a wall mount plate for a display apparatus includes a rear surface including a recess to accommodate a magnet, and making contact with a wall by use of a coupling member; and a frontal surface of the wall mount plate making contact with a bottom chassis of the display apparatus by use of magnetic force of the magnet.

In accordance with still another example of the disclosure, a display apparatus configured to be fixed onto a wall includes a bottom chassis having a rear surface facing the wall when a display panel displaying contents and the display apparatus are mounted on the wall, and the bottom chassis is configured to make contact with a wall mount plate fixed onto the wall by use of magnetic force.

The display apparatus may further include a rear cover disposed at a rear of the bottom chassis so as to make contact with the wall mount plate when the display apparatus is mounted on the wall.

A wall mount plate for a display apparatus capable of fixing the display apparatus onto a wall by use of magnetic force of a magnet may be provided.

A wall mount plate for a display apparatus capable of fixing the display apparatus onto a wall by use of magnetic force of a magnet provided in a recess may be provided.

A wall mount plate for a display apparatus capable of fixing the display apparatus onto a wall as a wall fixture by use of a thin thickness of the wall mount plate may be provided.

A display apparatus configured to be fixed onto a wall by use of magnetic force of a magnet may be provided.

In accordance with various examples of the disclosure without being limited hereto, a wall mount plate for a display apparatus capable of fixing the display apparatus onto a wall by use of magnetic force of a magnet may be provided.

BRIEF DESCRIPTION OF THE DRAWINGS

These and/or other aspects of the disclosure will become apparent and appreciated from the following detailed description, taken in conjunction with the accompanying drawings in which like reference numerals refer to like elements, and wherein:

FIG. 2 is a schematic lower view illustrating an example display apparatus, a magnet, and a wall mount plate;

FIG. 3 is a schematic exploded perspective view illustrating an example display apparatus, magnet, and wall mount plate;

FIG. 4A is a frontal perspective view illustrating an example wall mount plate;

DETAILED DESCRIPTION

Figure 1:
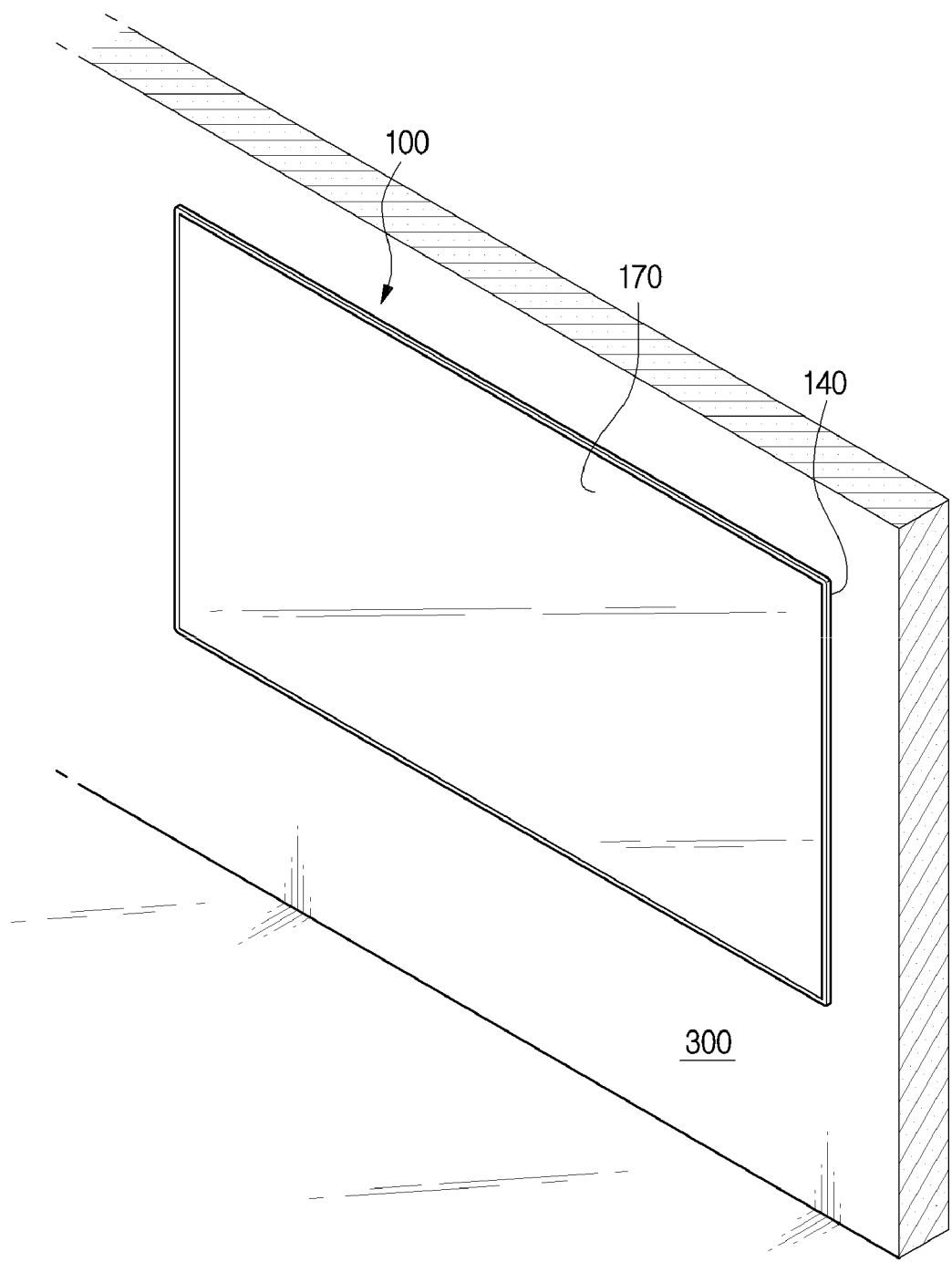
FIG. 1 is a schematic frontal perspective view illustrating an example display apparatus fixed onto a wall.

Reference will now be made to examples of the disclosure, examples of which are illustrated in the accompanying drawings, wherein like reference numerals refer to like elements throughout.

Terms containing numerals such as "the first," "the second," etc. may be used in describing various elements of structures, and the elements of structures described are not limited to the terms described. The terms described may be used for the purpose of distinguishing one single element of structure from another element of structure. For example, "the first element of structure" in the scope of the present disclosure may be classified as "the second element of structure." In addition, "the second element of structure" may be classified as "the first element of structure." The term "and/or" may include a certain category among the categories that are noted in describing a combination or a plurality of the described categories that are provided to be in plural units. "Content" may be shown on a display apparatus. For example, the content may include a video file or an audio file being played through a video player, which is an application, a music file being played through a music player, a photo file being displayed through a photo gallery and/or a web page file being displayed through a web browser. In addition, the content may include a broadcast being received.

The content may, for example, include the video file, the audio file, a text file, an image file or the web page being displayed or executed through an application. In addition, the content may, for example, include the video file and/or the audio file included in the broadcast signal being received.

In an example, the content being received from outside or the content being saved may, for example, include the video file, the audio file, a text file, an image file or the web page being displayed or executed through an application. In addition, the content may, for example, include the broadcast signal, the video file, the audio file, the text file, or the web page that are executed in response to a user input, for example, a touch by the user. In addition, the term "video" may be used when referring to a moving image.

The content may include an application screen and a user interface that composes the application screen, both of which are being executed. In addition, the content may include a single content or a plurality of contents.

An application refers, for example, to software being executed through an operating system (OS) of a desk top or through an operating system of the display apparatus for a user to use. For example, the application may include a word processor, a spreadsheet, a contacts application, a calendar application, a memo application, an alarm application, a SNS (Social Networking System) application, a chatting application, a map application, a music player, or a video player. The application in accordance with various examples may be referred to as software that may be executed through the display apparatus by corresponding to the user input being received. In addition, the application in accordance various examples may be referred to as software that may be executed through the display apparatus after being received and downloaded from an outside of the display apparatus.

In the examples, the term "height" in describing the height of the element of structure may be identically used as in the term "width" in describing the width of the element of structure. In corresponding to the coordinates of the axis of the element of structure, the term "height" may be identically used as in the term "width."

The terms used in the disclosure are used in describing the examples, and are not intended to limit and/or restrict the present disclosure. A singular expression of a term includes plural expression of the term unless otherwise specified differently. The term such as "include(s)" or "have (has)" in the disclosure is provided to clarify the presence of a certain characteristic, figure, motion, component, or part, or a combination of such, and the use of the term as such should be understood that the presence or the possibility of adding one or more of the certain characteristic, figure, motion, component, or part, or the combination of such is not to be excluded beforehand. The identical reference numerals presented on each drawing represent the members configured to execute identical functions in substance.

FIG. 1 is a schematic frontal perspective view illustrating an example display apparatus fixed onto a wall.

Referring to FIG. 1, a display apparatus 100 is fixed onto a wall by use of a wall mount plate 200 (FIG. 3).

The display apparatus 100 includes a display panel 170 configured to display contents, a bottom chassis 110 (FIG. 2) supporting the display panel 170, and a top chassis (not shown). In addition, the display apparatus 100, other than the components described above, includes various components, for example, a light source (not shown), a light guide late (not shown), a reflecting sheet (not shown), or a side frame 140.

The components included in the display apparatus 100 may be changed to correspond to reduced thickness of the display apparatus 100 may be easily appreciated by those skilled in the art.

The display apparatus 100 may, for example, be one of an output apparatus configured to output contents visually and/or aurally, and the display apparatus 100 may, for example, be a liquid crystal panel, a LED panel, or an organic LED panel may be installed into a wall 300 by use of a wall mount unit (not shown) as the display apparatus 100 is provided in a thin thickness.

The display apparatus 100 may, for example, be an analog TV, a digital TV, a 3D TV, a smart TV, a LED (light emitting diode) TV, an OLED (organic light emitting diode) TV, a plasma TV, a quantum dot TV, and/or a monitor. In addition, the display apparatus 100 may, for example, be a mobile phone having a display, a smart phone, a MP3 player, a video player, a tablet PC, an electronic board, and/or a wearable apparatus.

The display apparatus 100, may, for example, be implemented as a curved display apparatus having a screen provided with curvature, a flexible display apparatus having a screen provided with a fixed curvature, a bent display apparatus having a screen provided with a fixed curvature, and/or a curvature variable display apparatus capable of varying a curvature of a screen by use of a received user input. The implementation as such is not limited hereto, and such may be easily appreciated by those skilled in the art.

FIG. 2 is a schematic lower view illustrating an example display apparatus, a magnet, and the wall mount plate.

Referring to FIG. 2, a rear cover 112 may be coupled to a rear surface, for example, the bottom chassis 110, of the display apparatus 100. The rear cover 112 may, for example, be detachably and horizontally coupled to the rear surface of the display apparatus 100.

The rear cover 112 may, for example, be horizontally coupled to the rear surface of the display apparatus 100 with respect to a certain one of an upper end and a lower end of the top chassis (not shown). In addition, the rear cover 112 may, for example, be horizontally coupled to the rear surface of the display apparatus 100 with respect to a certain one of an upper end and a lower end of the bottom chassis 110.

The rear cover 112 may, for example, be perpendicularly coupled to the rear surface of the display apparatus 110 with respect to a certain one of a left side end and a right side of the top chassis (not shown). In addition, the rear cover 112 may, for example, be perpendicularly coupled to the rear surface of the display apparatus 100 with respect to a certain one of an upper end and a lower end of the top chassis.

Four units of or greater than four units of VESA holes or VESA mount holes may, for example, be formed at a lower chassis, for example, at the bottom chassis 110, of the display apparatus 100 according to the standard of the VESA (Video Electronics Standards Association). The standard of the VESA hole is defined by a combination of width and height, and is measured by use of mm units. The standard of the VESA hole may include the combination of 50×20, 75×35, 75×75, 75×50, 100×100, 100×50, 200×100, 200×50, or 200×200 or a combination greater than 200×200. The VESA hole (not shown) having the standard of the VESA may be formed at the rear surface of the display apparatus 100 in the form of a polygon or in the form of a letter "T."

Four units of or greater than four units of VESA holes (not shown) may, for example, be formed at a lower chassis, for example, at the bottom chassis 110, of the display apparatus 100 according to the non-standard of the VESA. The VESA hole (not shown) having the non-standard of the VESA may be formed at the rear surface of the display apparatus 100 in the form of a polygon or in the form of a letter "T."

The rear surface, for example, the bottom chassis 110, of the display apparatus 100 and the wall mount plate 200 may be coupled to one another by use of magnetic force. The rear surface 110 of the display apparatus 100 and the wall mount plate 200 fixed onto the wall 300 may be coupled by use of a magnet 250 accommodated at the wall mount plate 200. The bottom chassis 110 of the display apparatus 100 is fixed onto the wall 300, and may be coupled to the wall mount plate 200 having magnetic force.

A thickness t2 of the display apparatus 100 including the rear cover 12 is provided to be thicker than a thickness t1 of the display apparatus 100 excluding the rear cover 112. The thickness t1 of the display apparatus 100 excluding the rear cover 112 may, for example, be about 50% of the thickness t2 of the display apparatus 100 including the rear cover 112. The thickness t1 of the display apparatus 100 excluding the rear cover 112 may, for example, be greater than about 40% or less than about 70% of the thickness t2 of the display apparatus 100 including the rear cover 112.

The thickness of the display apparatus 100 excluding the rear cover 112 may be similar to the thickness t1 of the display apparatus 100. The coupled thickness of the bottom chassis 110 excluding the rear cover 112 and the top chassis (not shown) may be similar to the thickness of the display apparatus 100. For example, the thickness t1 of the display apparatus 100 excluding the rear cover 112 may be about 5.4 mm. The thickness t1 of the display apparatus 100 excluding the rear cover 112 may be greater than about 4.8 mm and less than 6.0 mm. The thickness t1 of the display apparatus 100 excluding the rear cover 112 may be greater than about 4.5 mm and less than 6.5 mm. In addition, the thickness t1 of the display apparatus 100 excluding the rear cover 112 may be greater than about 5.0 mm and less than 6.0 mm. The thickness t1 of the display apparatus 100 excluding the rear cover 112 may be changed in response to a reduction in thickness of the display apparatus 100 would be appreciated by those skilled in the art.

The rear cover 112 may not be coupled to the rear surface of the display apparatus to correspond to the reduced thickness of the display apparatus 100. In the case as such, the thickness t1 of the display apparatus 100 may be even. The thickness t1 of the display apparatus 100 may be greater than about 4.8 mm and less than 6.0 mm. The thickness t1 of the display apparatus 100 may be greater than about 4.5 mm and less than 6.5 mm. In addition, the thickness t1 of the display apparatus 100 may be greater than about 5.0 mm and less than 6.0 mm.

The rear surface of the display apparatus 100 may be flat. The curvature of the rear surface of the bottom chassis 110 may be identical to the curvature of the display panel 170.

The curvature of the rear surface of the display apparatus 100 and the curvature of the display panel 170 may be different to each other. For example, the curvature of the display panel 170 may be greater than or identical to the curvature of the rear surface of the display apparatus 100. In addition, the curvature of the display panel 170 may be less than the curvature of the rear surface of the display apparatus 100.

FIG. 3 is a schematic exploded perspective view illustrating an example display apparatus, magnet, and wall mount plate.

FIG. 4A is a frontal perspective view illustrating an example wall mount plate.

Figure 4B:
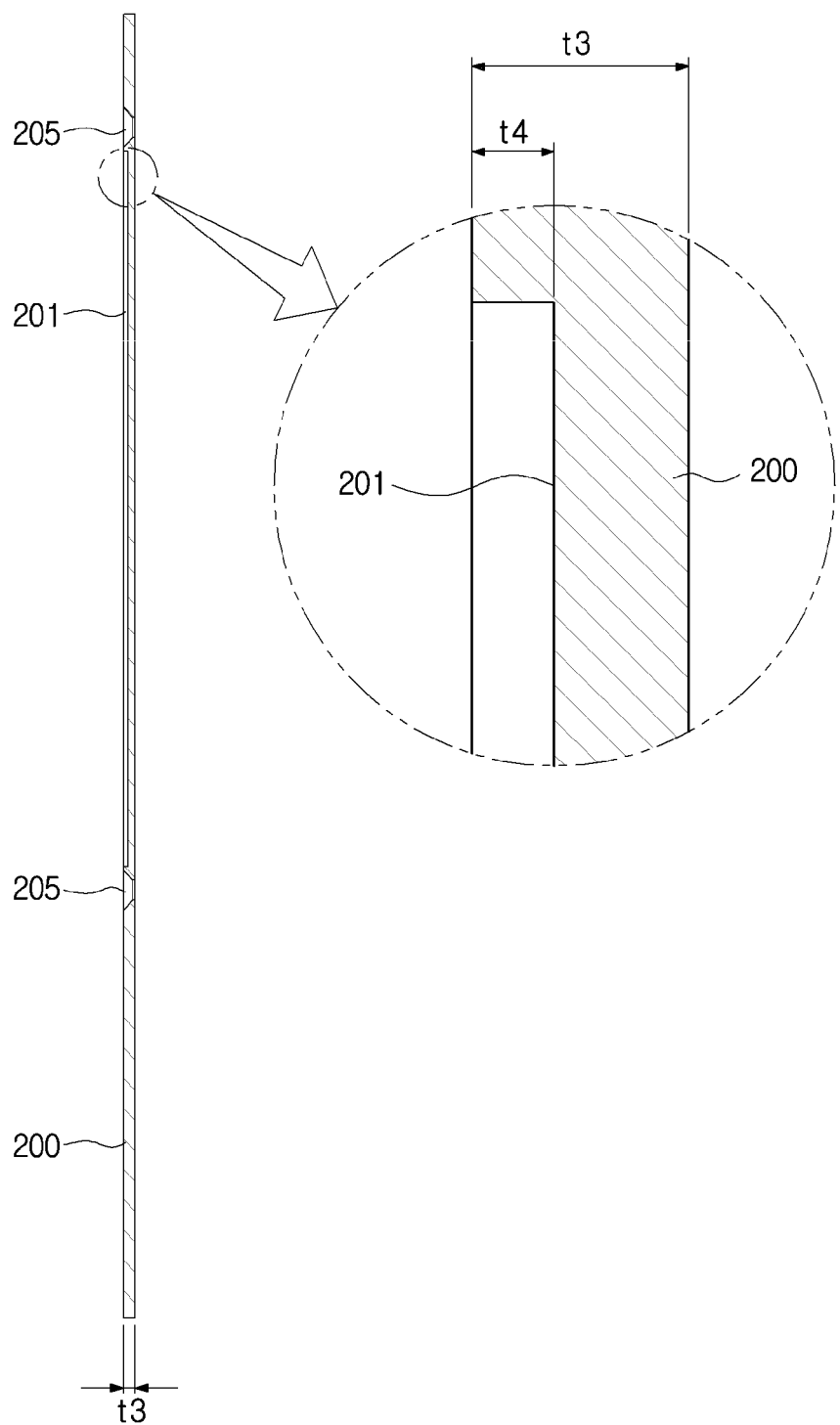
FIG. 4B is a cross-sectional view illustrating an example wall mount plate.

FIG. 4B is a cross-sectional view illustrating an example wall mount plate.

Referring to FIG. 3, FIG. 4A, and FIG. 4B, the wall mount plate 200 may be fixed onto a front surface of the wall 300 and provided to accommodate a magnet 250, and the display apparatus 100 fixed onto the wall mount plate 200 while making contact with the wall mount plate 200 are illustrated.

The display apparatus 100 includes the bottom chassis 110, a light source (not shown), a light guiding panel (not shown), a reflection sheet (not shown), a middle holder (not shown), an optical sheet (not shown), a side frame (not shown), the display panel 170, and the top chassis (not shown).

The bottom chassis 110 may support the light guiding panel (not shown) at a rear of the light guiding panel (not shown). The bottom chassis 110 may accommodate the components, for example, the light source (not shown), the light guiding panel (not shown), the reflection sheet (not shown), the middle holder (not shown), the optical sheet (not shown), and the side frame (not shown).

The bottom chassis 110 is provided with high strength, and may include metallic material, for example, aluminum, having less thermal deformation by the heat generated from the accommodated light source and/or the display panel 170. The metallic material includes light metals having the weight less than 4, and may include, for example, magnesium, beryllium, titanium, alkali metals, or alkali earth metals. The metallic material may include nonferrous metals which excludes iron and alloy having iron as main property.

The bottom chassis 110 may be processed by use of PC (poly carbonate) material. In addition, the bottom chassis 110 may be processed by adding glass fiber to the poly carbonate material.

The light source (not shown) is supported at a bottom of the bottom chassis 110, and may emit light by use of the power supplied from outside. The light source (not shown) is provided to perform a role as a back light at the display apparatus 100 while emitting light toward a direction of the display panel 170. The light source (not shown) may, for example, be a LED (light emitting diode) or a CCFL (cold cathode fluorescent lamp: not shown).

The light source (not shown) may include a plurality of LED bars (not shown) composed of a plurality of LEDs. The LED bars (not shown) may be parallelly disposed at an inside, for example, at a bottom, of the bottom chassis 110 while spaced apart with respect to each other. One pair of the plurality of LEDs (not shown) may be disposed at both side surfaces, for example, upper/lower side surfaces or left/rear side surfaces, of the bottom chassis 110. The plurality of LED bars may be disposed at one side surface, for example, a certain one of the upper/lower side surfaces, or a certain one of the left/rear side surfaces, of the bottom chassis 110. In addition, the plurality of LED bars may all be disposed at side surfaces, for example, upper/lower/left/right side surfaces, of the bottom chassis 110.

In a case when the display panel 170 is provided as an organic LED, a light source (not shown) may not be present.

The light guiding panel (not shown) may evenly guide the light emitted from the light source (not shown) at a screen. The light guiding panel (not shown) may be transparent plastic material.

The reflection sheet (not shown) may be disposed at an upper portion of the light source (not shown), and is provided to enhance optical efficiency by reflecting leaking light toward a direction of the display panel 170. The reflection sheet may be coated by use of high-reflection coating material, for example, silver, Ti02 in white or silver. The reflection sheet may be provided with a plurality of openings (not shown) corresponding to the protrusions of the plurality of LEDs positioned at the bottom chassis 110. The plurality of LEDs 121 protruded from the openings (not shown) of the reflection sheet is provided to emit light toward a direction of the reflection sheet. The reflection sheet may include the shape of a sheet or the shape of a plate.

The side frame 140 may be detachably coupled to the top chassis (not shown). The side frame 140 may be coupled to the top chassis (not shown) and the bottom chassis 110. The side frame 140 may be positioned in between the top chassis (not shown) and the bottom chassis 110. The side frame 140 may be detachably coupled to the bottom chassis 110.

The optical sheet (not shown) may be provided such that the light emitted from the light source (not shown) and then passed through is provided with even curvature. The light having even curvature that is passed through the optical sheet (not shown) is incident at the display panel 170.

The optical sheet (not shown) may include a protective sheet, a prism sheet, or a diffuser sheet. The optical sheet (not shown), may include, not only three sheets, but two or more than four sheets.

The display panel 170 may include a TFT (thin film transistor) board and a LCD (liquid crystal display panel). The display panel 170 may include a TFT (thin film transistor) board and an AMOLED (active organic light emitting diode). In addition, the display panel 170 may include a TFT (thin film transistor) board and an OLED (organic light emitting diode). The display panel 170 is not limited to the methods described above, and such would be appreciated by those skilled in the art.

The display panel 170 may include a polarized plate (not shown) and/or a color filter (not shown).

The display panel 170 may be provided at a lower end thereof with a printed circuit board 190 (FIG. 2) configured to generate driving signals to drive the display panel 170. The display panel 170 may be provided at an upper end thereof with the printed circuit board 190 configured to generate driving signals to drive the display panel 170.

The display panel 170 may be provided at a certain one of a left side thereof and a right side thereof, or at the both of the left side and the right side thereof, with the printed circuit board 190 configured to generate driving signals to drive the display panel 170.

The display panel 170 and the printed circuit board 190 may be electrically connected to each other through a chip-on film (not shown). The display panel 170 supported at an inside the bottom chassis 110 and the printed circuit board 190 positioned at an outside of the bottom chassis 190 may be electrically connected by use of the chip-on film (not shown). Portions of the printed circuit board 190 and the chip-on film (not shown) each positioned at an outside of the bottom chassis 110 may not be exposed to an outside by use of the rear cover 112.

The display panel 170, the chip-on film (not shown), and the printed circuit board 190 may reciprocally connected toward a direction of gravity.

The top chassis (not shown) is fastened by use of the side frame (not shown) and a screw (not shown). The top chassis (not shown) is disposed at a front of the display apparatus 100, and may prevent an impact applied from an outside with respect to the components accommodated at an inside, and/or a outside leak, for example, a light loss, of the light emitted from the inside light source (not shown).

The top chassis (not shown) may be formed around the border of the display panel 170. The top chassis (not shown) may be provided with a cross-sectional shape, for example, the shape of a letter "⌐," that may cover upper and side borders of the display panel 170. The top chassis (not shown) includes an opening (not shown). Contents that are output from the display panel 170 may be provided through the opening (not shown).

As the width of the bezel of the top chassis (not shown) is further narrowed, the degree of concentration of the contents displayed at the display apparatus 100 may also be increased. In addition, as the width of the bezel of the top chassis (not shown) is further narrowed, the display apparatus 100 may provided a screen that is wider as much as the narrowed length of the bezel with respect to the size of the identical display apparatus 100 to a user.

A front mask (not shown) may cover a front of the top chassis (not shown). The front mask (not shown) may be certain one material of film material, metal material, and plastic material. The front mask (not shown) may be implemented in an identical color as the top chassis (not shown), the side frame 140, and the bottom chassis 110. The front mask (not shown) may be transparent or less transparent. In addition, the front mask (not shown) may be implemented in different color from a certain one of the top chassis (not shown), the side frame 140, and the bottom chassis 110.

The term "bezel" in the display apparatus 100 may, for example, refer to the width of the front mask (not shown) covering the front of the four edges, excluding the opening (not shown), of the top chassis (not shown). The term "bezel" in the display apparatus 100 may refer to a front of the four edges, excluding the opening (not shown) of the top chassis (not shown). In addition, the term "bezel" in the display apparatus 100 may refer to the total length of the widths, that is, the width of the front mask (not shown) covering the front of the four edges, excluding the opening (not shown), of the top chassis (not shown), and the width of a portion of the side frame 140 exposed to a front of the display apparatus 100.

The wall mount plate 200 may be fastened to the wall 300 by use of, for example, a plurality of screws 211, a certain one of possible fastening members. The wall mount plate 200 may be fixed onto the wall 300 by use of the plurality of screws 211 provided to penetrate through screw holes 205 of the wall mount plate 200.

The wall mount plate 200 may be metallic material that may be coupled to a magnet, plastic material that may be bonded with respect to a magnet, or ceramic material.

The fixing of the wall mount plate 200 to the wall 300 by use of the screws 211 is provided as one example, and is not limited hereto. For example, the wall mount plate 200 may be fixed onto the wall 300 by use of a rivet, an adhesive tape, an adhesion, or the like. In a case when the wall 300 is provided with metallic material, the wall mount plate 200 may be fixed onto the wall having metallic material by use of welding. The methods of fixing the wall mount plate 200 to the wall 300, in addition to the method described above, may vary, and such would be appreciated by those skilled in the art.

The plurality of screw holes 205 may be formed in the wall mount plate 200. The screw holes 205 formed in the wall mount plate 200 may be positioned outside of a recess 201. In another embodiment of the present disclosure, one of the plurality of the screw holes 205 formed at the wall mount plate 200 may be positioned at an inside of the recess 201.

When the magnetic force of the magnet 250 is provided with a strong magnetic force and is provided in small size, the size, for example, the width and the length, of the recess 201 may be decreased. In addition, when the magnetic force of the magnet 250 is provided with a strong magnetic force and is provided in small size, the size, for example, the width and the length, of the wall mount plate 200 may be decreased. Accordingly, one of the plurality of screw holes 205 formed at the wall mount plate 200 may be positioned at an inside of the recess 201. In addition, when the magnetic force of the magnet 250 is provided with a strong magnetic force and is provided in small size, the plurality of screw holes 205 formed at the wall mount plate 200 may all be positioned at an inside of the recess 201.

The number of the screw holes 205 may be changed corresponding to the weight of the display apparatus 100. When the weight is the display apparatus 100 is heavy, the number of the screw holes 205 may be increased. The number of the screws 211 provided to fix the wall mount plate 200 to the wall 300 may be increased as to correspond to the increase of the number of the screw holes 205.

When the wall mount plate 200 is fixed to the wall 300, the head of the screw 211 fixed to the wall 300 after penetrating through, for example, the stepped or tapered screw hole 205 may not protrude toward the rear surface 110 of the display apparatus 100 while having the cross section of the wall mount plate 200 as a reference. For example, with respect to the head of the screw 211 when protruding toward the rear surface 110 of the display apparatus 100 while having the cross section of the wall mount plate 200 as a reference, the display apparatus 100 may not be aligned by use of the head of the protruded screw 211.

The number of the screw holes 205 may be changed corresponding to the strength of the magnetic force generated from the magnet 250. In a case when the strength of the magnetic force generated from the magnet 250 is strong, the number of the screw holes 205 may be increased. The number of the screws 211 provided to fix the wall mount plate 200 to the wall 300 may be increased by corresponding to the increase of the number of the screw holes 205.

In addition, the number of the screw holes 205 may be changed corresponding to the combination of the strength of the weight of the display apparatus 100 and the strength of the magnetic force generated from the magnet 250. When the weight of the display apparatus 100 is heavy and when the strength of the magnetic force generated from the magnet 250 is strong, the number of the screw holes 205 may be increased. The number of the screws 211 to fix the wall mount plate 200 to the wall 300 may be increased by corresponding to the increase of the number of the screws 211.

The wall mount plate 200 includes a recess 201 to accommodate the magnet 250. The thickness t3 of the wall mount plate 200 may, for example, be about 4 mm. In addition, the thickness t3 of the wall mount plate 200 may be greater than about 2 mm. The thickness t3 of the wall mount plate 200 may vary corresponding to the thickness t2−t1 of the rear cover 112 of the display apparatus 100.

The shape of the wall mount plate 200 may include a polygon, a circular shape, an oval shape, or a freely formed shape.

The thickness t3 of the wall mount plate 200 may be thicker than the thickness t2−t1 of the rear cover 112 of the display apparatus 100. When the thickness t2−t1 of the rear cover 112 of the display apparatus 100 is thicker than the thickness t3 of the wall mount plate 200, the display apparatus 100 may be coupled at an incline with respect to the wall mount plate 200 by use of magnetic force while having the wall 300 as a reference. When the thickness t2−t1 of the rear cover 112 of the display apparatus 100 is thicker than the thickness t3 of the wall mount plate 200, the rear surface 110 of the display apparatus 100 may be spaced apart with respect to the wall mount plate 200. The display apparatus may be seen as a built-in display apparatus as the thickness of the wall mount plate 200 is thin.

When the thickness t2−t1 of the rear cover 112 of the display apparatus 100 is thicker than the thickness t3 of the wall mount plate 200, the rear surface 110 of the display apparatus 100 may not be coupled to the wall mount plate 200. In addition, when the thickness t2−t1 of the rear cover 112 of the display apparatus 100 is thicker than the thickness t3 of the wall mount plate 200, the rear surface 110 of the display apparatus 100 may be detached without being coupled by magnetic force to the wall mount plate 200. The detached display apparatus 100 may fall to a floor, for example, toward a gravitational direction.

The edges of the wall mount plate 200 may, for example, be chamfer-treated or fillet/round-treated.

The magnet 250 may be accommodated in the recess 201 of the wall mount plate 200. The depth t4 of the recess 201 of the wall mount plate 200 may be identical or different with respect to the thickness of the magnet 250. The wall mount plate 200 having the depth t4 of the recess 201, which is changed corresponding to the thickness of the magnet 250, may be provided.

The magnet 250 may be a soft plastic magnet, which is one example of a permanent magnet. The soft plastic magnet may, for example, be referred to as a rubber magnet. The rubber magnet may be classified into an isotropic rubber magnet, an anisotropic rubber magnet, or a semi-anisotropic magnet. The magnet 250 in the examples may include the anisotropic rubber magnet. One surface of the magnet 250 may be attached to a bottom of the recess 201 of the wall mount plate 200 by use of magnetic force.

The size and thickness of the rubber magnet may vary according to use. The size of the rubber magnet, for example, the width and the length of the rubber magnet, may be provided in the shape of a polygon, and is not limited hereto. For example, the rubber magnet may be provided in the shape of a circle or an oval. In addition, the size and shape of the magnet may vary according to the size and shape of the recess 201 of the wall mount plate 200, and such would be easily appreciated by those skilled in the art.

The strength of the magnetic force, for example, Tesla T or Gauss G, may be increased as the thickness of the rubber magnet increases. In addition, the larger the rubber magnet, the greater the strength of the magnet.

The strength of the magnet 250 in the examples may, for example, be less than about 3000 G. In addition, the strength of the magnet 250 in the examples may be greater than about 500 G and less than about 500 G.

In addition, the rubber magnet may include the more than two rubber magnets that are overlapped each other. The overlapped rubber magnets may be accommodated at the recess 201 of the wall mount plate 200 corresponding to the weight of the display apparatus 100.

One surface of the magnet 250 may be attached to a bottom of the recess 201 of the wall mount plate 200, not only by magnetic force, but also by adhesion. When one surface of the magnet 250 is attached to a bottom of the recess 201 of the wall mount plate 200 by adhesion, the magnet 250 may sufficiently support the display apparatus 100.

The magnet 250 may be a neodymium magnet, which is an example of a permanent magnet, having strong magnetic force, or a ferrite magnet having stronger magnetic force than the rubber magnet but having less magnetic force than the neodymium magnet. The neodymium magnet or the ferrite magnet may be implemented in the shape of a circle, a ring or a donut, a sphere, or a hexagon.

The neodymium magnet, when compared to the rubber magnet, is provided in smaller size but with strong magnetic force. For example, in a case of the hexagonal neodymium magnet having a dimension of about 6 mm of width, about 6 mm of depth, and about 2 mm in height, the strength of the magnetic force of the hexagonal neodymium magnet may be about 2300 G. In addition, in a case of the hexagonal neodymium magnet having a dimension of about 50 mm of width, about 50 mm of depth, and about 10 mm in height, the strength of the magnetic force of the hexagonal neodymium magnet may be about 3500 G.

The ferrite magnet, when compared to the rubber magnet, is provided in smaller size but with strong magnetic force. For example, in a case of the ring-shaped ferrite magnet having a dimension of about 55 mm of diameter, about 25 mm of diameter of an inner hole, and about 8 mm in height, the strength of the magnetic force of the ring-shaped ferrite magnet may be about 900 G. The neodymium magnet or the ferrite magnet may be provided with different strength of magnetic force according to the size and height thereof.

When the magnet being accommodated at the recess 201 of the wall mount plate 200 is one of the neodymium magnet and the ferrite magnet, the area of the recess 201 of the wall mount plate 200 may be smaller than the area of the recess 201 of the wall mount plate 200 in which the rubber magnet is accommodated. In addition, the area of the recess 201 of the wall mount plate 200 in which the plurality of neodymium magnets and the plurality of ferrite magnets, all of which are provided in small sizes but with strong magnetic force, may be smaller than the area of the recess 201 of the wall mount plate 200 in which the rubber magnet is accommodated.

A plurality of recesses (not shown) may be formed at the wall mount plate 200 while corresponding to the areas of the plurality of neodymium magnets, for example, the neodymium magnets provided in the shape of a circle, a ring, and a rectangle, that is provided in small size but with strong magnetic force. The spaces in between the ferrite magnets may be identical or different with respect to each other.

In an example, the wall mount plate 200 may itself be a magnet. When the wall mount plate 200 is a magnet, the recess 201 is not provided at the wall mount plate 200, while the screw holes 205 may be formed at the wall mount plate 200.

Figure 5:
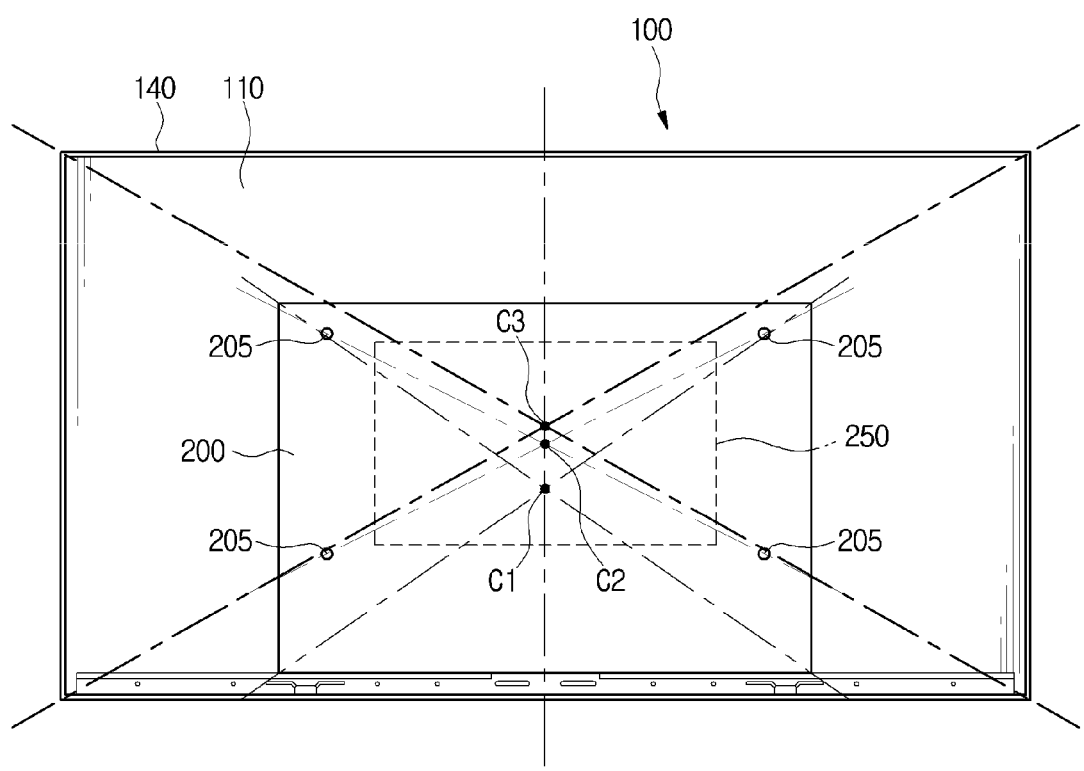
FIG. 5 is a schematic lower view illustrating a central portion of an example display apparatus, a central portion of the magnet, and a central portion of the wall mount plate.

FIG. 5 is a schematic lower view illustrating an example central portion of the display apparatus, a central portion of the magnet, and a central portion of the wall mount plate.

Referring to FIG. 5, the central point c1 of the wall mount plate 200 and the central point c2 of the recess 201 are not identical. The central point c2 of the recess 201 may be positioned at a higher location than the central point c1 of the wall mount plate 200 with reference to a lower end of the bottom chassis 110.

The wall mount plate 200 and the display apparatus 100 may be aligned by corresponding to the contact between a lower end of the wall mount plate 200 and an upper end of the rear cover 112. As the wall mount plate 200 is aligned, the central point c1 of the wall mount plate 200 and the central point c2 of the recess 201 are not provided to be identical.

The central point c1 of the wall mount plate 200, the central point c2 of the recess 201, and the central point c3 of the display apparatus 100 are not identical to one another. Using a lower end of the bottom chassis 110 as a reference, the central point c1 of the wall mount plate 200 may be positioned at the lower location, then the central point c2 of the recess 201 may be positioned at a location higher than the central point c1 of the wall mount plate 200, and the central point c3 of the display apparatus 100 may be positioned at the highest location.

The central point c1 of the wall mount plate 200, the central point c2 of the recess 201, and the central point c3 of the display apparatus 100 may not be identical with respect to one another. The central point c2 of the recess 201 and the central point c3 of the display apparatus 100 may be identical to each other.

Virtual lines connecting the central point c1 of the wall mount plate 200 and the corner points, which are facing each other, of the wall mount plate 200 may pass through some of the screw holes of the plurality of screw holes 205. The virtual lines that are provided to connect the corner points, which are facing each other, of the recess 201 and the central point c2 of the recess 201 may pass through some of the screw holes of the plurality of screw holes 205. In addition, the virtual lines that are provided to connect the corner points, which are facing each other, of the display apparatus 100 and the central point c3 of the display apparatus 100 may pass through some of the screw holes of the plurality of screw holes 205.

Figure 6A:
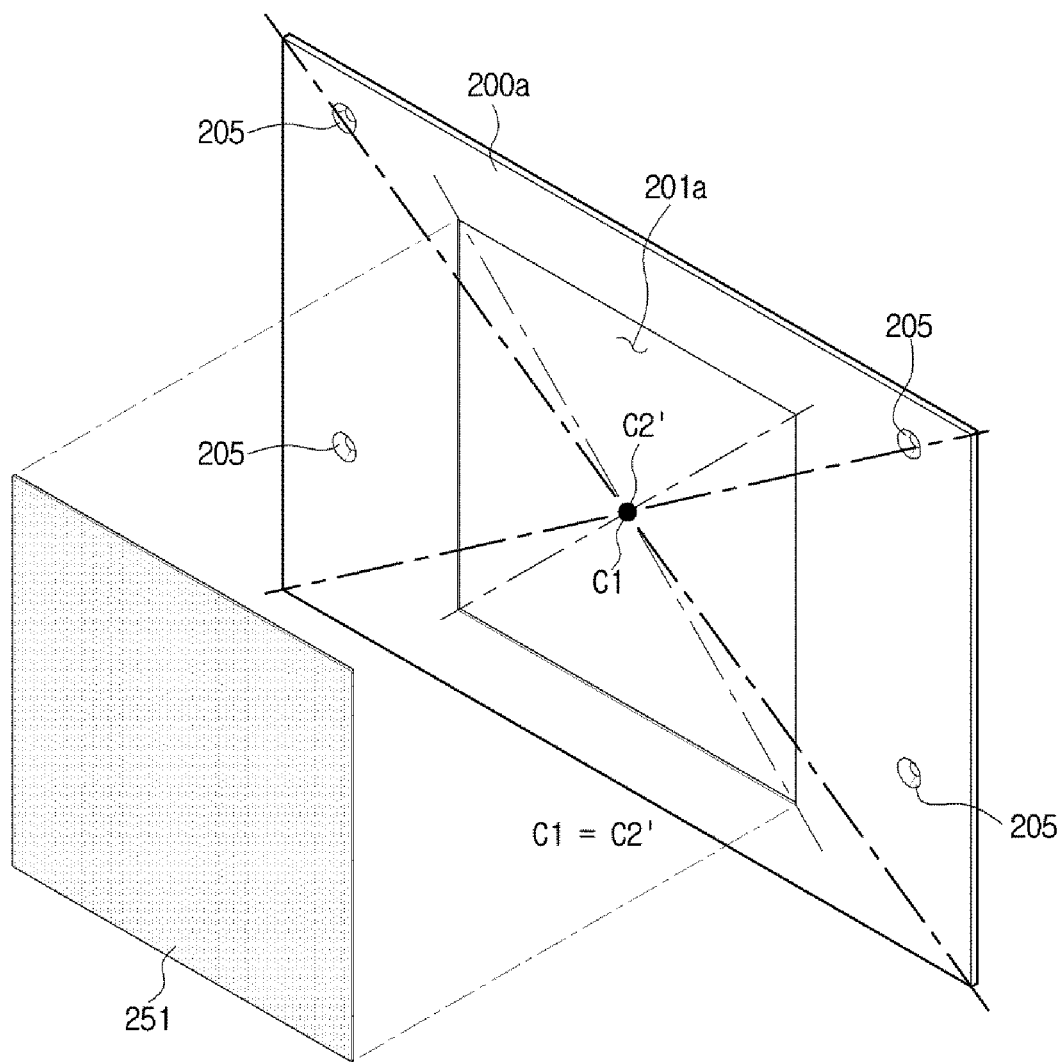
FIG. 6A is a frontal perspective view illustrating an example wall mount plate.

FIG. 6A is a frontal perspective view illustrating an example wall mount plate.

Figure 6B:
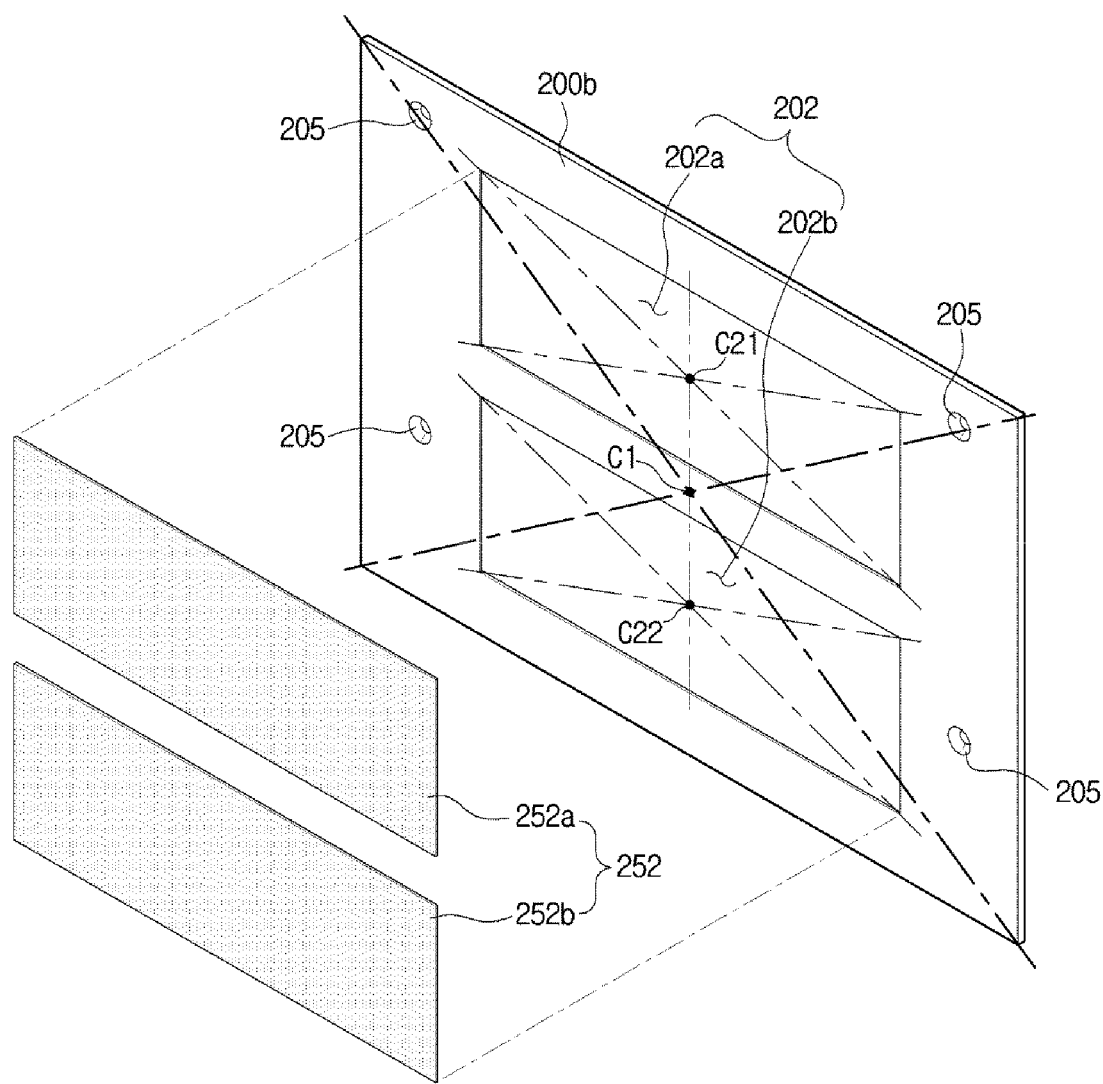
FIG. 6B is a frontal perspective view illustrating an example wall mount plate.

FIG. 6B is a frontal perspective view illustrating another example wall mount plate.

Figure 6C:
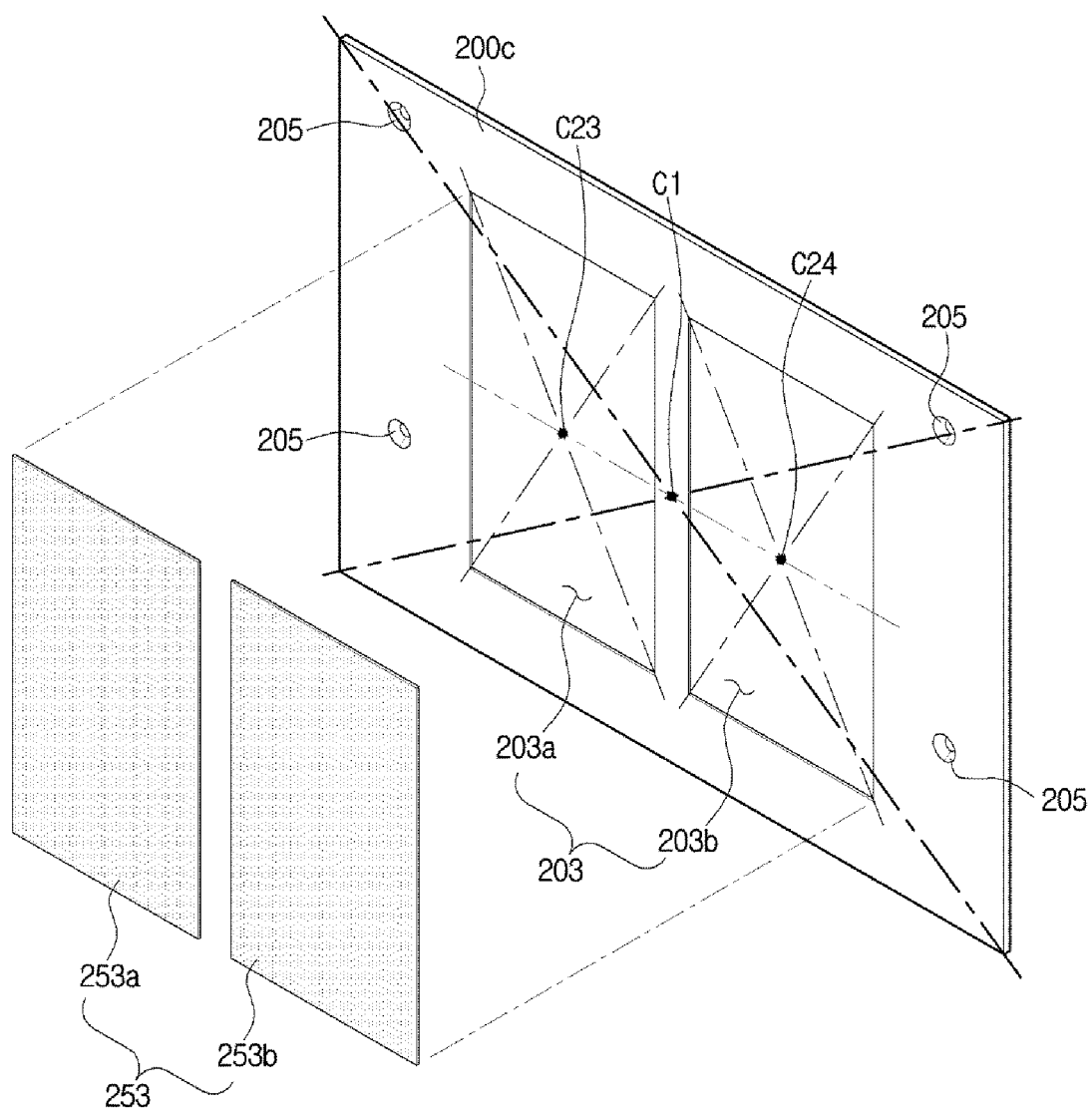
FIG. 6C is a frontal perspective view illustrating an example wall mount plate.

FIG. 6C is a frontal perspective view illustrating another example wall mount plate.

Referring to FIG. 6A, a recess 201a of a wall mount plate 200a may be provided with the shape of a square. A magnet 251 corresponding to the recess 201a having the shape of a square may be provided with the shape of a square.

The central point c2' of the recess 201a having the shape of a square and the central point c1 of the wall mount plate 200a may be coincident with each other. The central point c2' of the recess 201a having the shape of a square and the central point c3 of the display apparatus 100 may be different from each other. In addition, the central point c1 of the wall mount plate 200a and the central point c3 of the display apparatus 100 may be different from each other.

Virtual lines connecting the central point c1 of the wall mount plate 200a and the four edges of the wall mount plate 200a may pass through some of the screw holes of the plurality of screw holes 205. In addition, when the positions of some of the screw holes are changed, virtual lines connecting the central point c1 of the wall mount plate 200a and the four edges of the wall mount plate 200 may pass through all the screw holes of the plurality of screw holes 205.

Referring to FIG. 6B, a wall mount plate 200b may include a plurality of recesses 202a and 202b. A magnet 252 corresponding to the plurality of recesses 202 may also be provided in plurality of units. The recess 202a of an upper end and the recess 202b of a lower end may be formed at the wall mount plate 200b. In addition, the wall mount plate 200b may include at least three levels of recesses (not shown) from an upper end to a lower end.

The usefulness of the magnet 252 corresponding to the plurality of recesses 202 may be enhanced. The strength of magnetic force of the plurality of magnets 252a and 252b accommodated at the plurality of recesses 202 may be identical or different with respect to each other. The strength of magnetic force of a certain one magnet of the plurality of magnets 252a and 252b may be high. For example, the strength of magnetic force of the magnet 252a accommodated at the upper end recess 202a of the plurality of recesses 202 may be greater than the strength of magnetic force of the magnet 252b accommodated at the lower end recess 202a of the plurality of recesses 202. In an opposite case, for example, when the recess is changed, the above may be identically applied.

In addition, the types of the plurality of magnets 252a and 252b accommodated at the plurality of recesses 202 may be identical or different with respect to each other. One magnet of the plurality of magnets 252a and 252b may be a rubber magnet, and the other magnet of the plurality of magnets 252a and 252b may be a neodymium magnet or a ferrite magnet. For example, the magnet 252a accommodated at the upper end recess 202a of the plurality of recesses 202 may be the rubber magnet, and the magnet 252b accommodated at the lower end recess 202b of the plurality of recesses 202 may be the neodymium magnet or the ferrite magnet. In an opposite case, for example, when the recess is changed, the above may be identically applied.

When the types of the plurality of magnets 252a and 252b accommodated at the plurality of recesses 202 are different, the area of the recess (not shown) of the plurality of recesses 202 in which the neodymium magnet or the ferrite magnet is accommodated may be smaller than the area of the recess in which the rubber magnet is accommodated.

The central point c21 of the recess 202a and the central point c22 of the recess 202b may be different from the central point c1 of the wall mount plate 200b. The central point c21 of the recess 202a and the central point c22 of the recess 202b may be different from the central point c3 (FIG. 5) of the display apparatus 100. In addition, the central point c1 of the wall mount plate 200b and the central point c3 (FIG. 5) of the display apparatus 100 may be different from each other.

Virtual lines connecting the central point c1 of the wall mount plate 200b and the four edges of the wall mount plate 200b may pass through some of the screw holes of the plurality of screw holes 205. In addition, when the positions of some of the screw holes are changed, virtual lines connecting the central point c1 of the wall mount plate 200b and the four edges of the wall mount plate 200 may pass through all the screw holes of the plurality of screw holes 205.

Referring to FIG. 6C, differently from FIG. 6B, a recess 203a of the left side and a recess 203b of the right side may be formed at a wall mount plat 200c. A magnet 253 corresponding to the plurality of recesses 203 may also be provided in a plurality of units. In addition, the wall mount plate 200c may include at least three levels of recesses (not shown) from a left side to a right side.

The usefulness of the magnet 253 corresponding to the plurality of recesses 202 may be enhanced. The strength of magnetic force of the plurality of magnets 253a and 253b accommodated at the plurality of recesses 203 may be identical or different with respect to each other. The strength of magnetic force of a certain one magnet of the plurality of magnets 253a and 253b may be high. For example, the strength of magnetic force of the magnet 253a accommodated at the right side recess 203a of the plurality of recesses 203 may be greater than the strength of magnetic force of the magnet 253b accommodated at the left side recess 203a of the plurality of recesses 203. In an opposite case, for example, when the recess is changed, the above may be identically applied.

In addition, the types of the plurality of magnets 253a and 253b accommodated at the plurality of recesses 203 may be identical or different with respect to each other. One magnet of the plurality of magnets 253a and 253b may be a rubber magnet, and the other magnet of the plurality of magnets 253a and 253b may be a neodymium magnet or a ferrite magnet. For example, the magnet 253a accommodated at the left side recess 203a of the plurality of recesses 203 may be the rubber magnet, and the magnet 253b accommodated at the right side recess 203b of the plurality of recesses 203 may be the neodymium magnet or the ferrite magnet. In an opposite case, for example, when the recess is changed, the above may be identically applied.

When the types of the plurality of magnets 253a and 253b accommodated at the plurality of recesses 203 are different, the area of the recess (not shown) of the plurality of recesses 203 in which the neodymium magnet or the ferrite magnet is accommodated may be smaller than the area of the recess in which the rubber magnet is accommodated.

The central point c23 of the recess 203a and the central point c24 of the recess 203b may be different from the central point c1 of the wall mount plate 200c. The central point c23 of the recess 203a and the central point c24 of the recess 203b may be different from the central point c3 (FIG. 5) of the display apparatus 100. In addition, the central point c1 of the wall mount plate 200c and the central point c3 (FIG. 5) of the display apparatus 100 may be different from each other.

Virtual lines connecting the central point c1 of the wall mount plate 200c and the four edges of the wall mount plate 200c may pass through some of the screw holes of the plurality of screw holes 205. In addition, when the positions of some of the screw holes are changed, virtual lines connecting the central point c1 of the wall mount plate 200c and the four edges of the wall mount plate 200c may pass through all the screw holes of the plurality of screw holes 205.

In an example, the wall mount plate 200 may include the wall mount plate 200a of FIG. 6A, the wall mount plate 200b of FIG. 6B, or the wall mount plate 200c of FIG. 6C.

Figure 7:
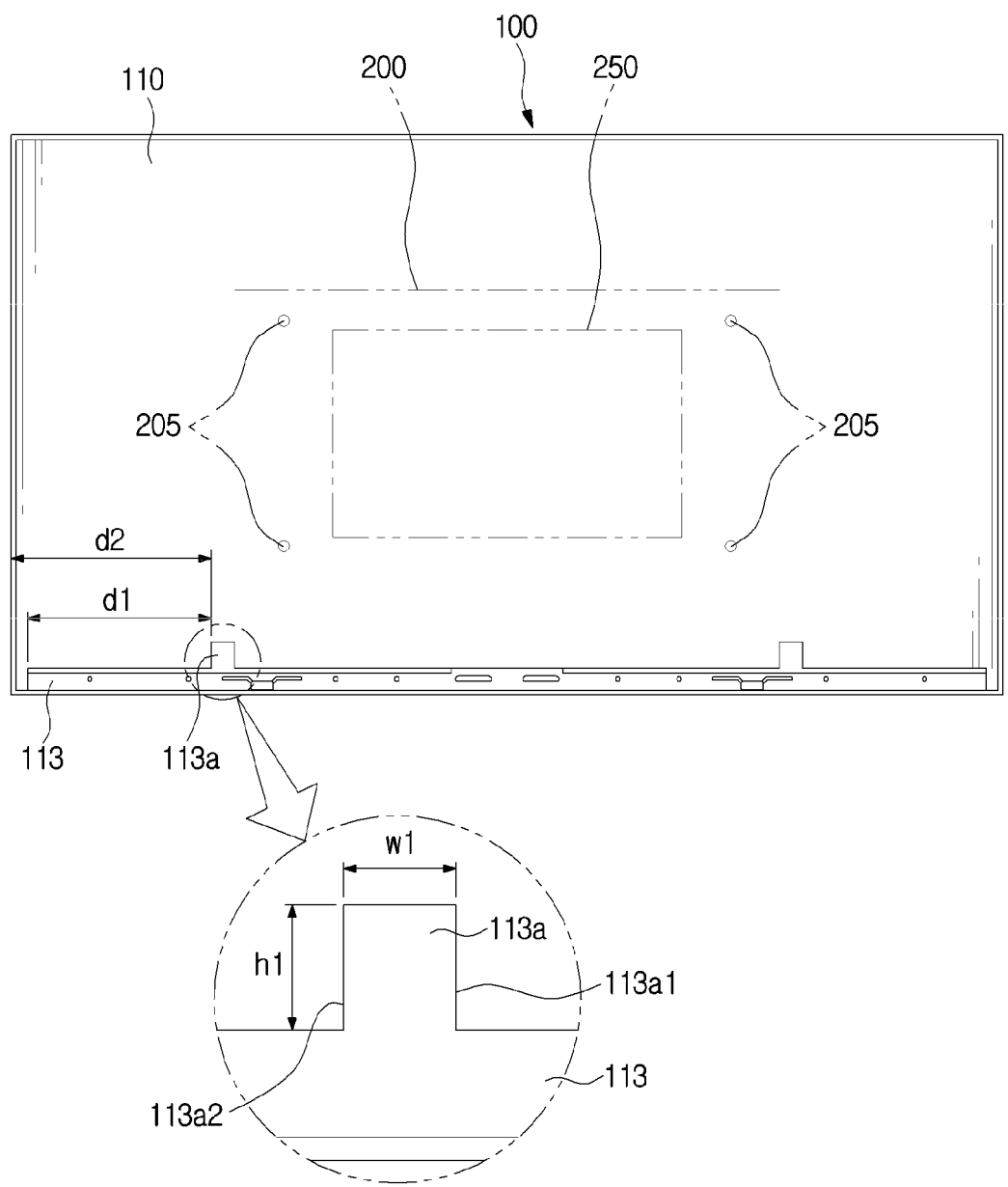
FIG. 7 is a schematic lower view illustrating an example display apparatus, a magnet, and a wall mount plate.

FIG. 7 is a schematic lower view illustrating an example display apparatus, a magnet, and a wall mount plate.

Referring to FIG. 7, a rear cover 113 having a wall mount guide 113a may be coupled to the rear surface 110 of the display apparatus 100. The rear cover 113 having the wall mount guide 113a may be detachably and parallelly coupled to the rear surface of the display apparatus 100.

The rear cover 113 having the wall mount guide 113a may be parallelly coupled to the rear surface of the display apparatus 100 with respect to a certain one of an upper end and a lower end of the top chassis (not shown). In addition, the rear cover 113 having the wall mount guide 113a may be parallelly coupled to the rear surface of the display apparatus 100 with respect to a certain one of an upper end and a lower end of the bottom chassis 110.

The rear cover 113 having the wall mount guide 113a may be vertically coupled to the rear surface of the display apparatus 100 with respect to a certain one of a left side and a right side of the top chassis (not shown). In addition, the rear cover 113 having the wall mount guide 113a may be vertically coupled to the rear surface of the display apparatus 100 with respect to a certain one of an upper end and a lower end of the top chassis (not shown).

The rear cover 113 may include the wall mount guide 113a protruding in an upper direction with reference a lower end of the bottom chassis 110. The wall mount guide 113a protruding upwardly may be formed in a single unit or in a plurality of units of more than two units.

The height h1, for example, about 50 mm, which may be changed corresponding to the size of the wall mount plate, and the width w1, for example, about 50 mm, which may be changed corresponding to the size of the wall mount plate, of the upwardly protruded wall mount guide 113a may be identical. In addition, the height h1 of the upwardly protruding wall mount guide 113a may be longer than the width w1 of the upwardly protruding wall mount guide 113a. The height h1 of the upwardly protruding wall mount guide 113a may be shorter than the width w1 of the upwardly protruding wall mount guide 113a.

A side surface 113a1 of the upwardly protruding wall mount guide 113a may make contact with one side of the wall mount plate 200. A portion of the side surface 113a1 of the upwardly protruding wall mount guide 113a may make contact with one side of the wall mount plate 200.

When an edge of the side surface 113a1 of the upwardly protruding wall mount guide 113a is chamfer-treated, for example, c=1, only a portion of the side surface 113a1 of the upwardly protruding wall mount guide 113a make contact with one side of the wall mount plate 200. When an edge of the side surface 113a1 of the upwardly protruding wall mount guide 113a is fillet/round-treated, for example, R=1, only a portion of the side surface 113a1 of the upwardly protruding wall mount guide 113a makes contact with one side of the wall mount plate 200.

When a taper-treatment is performed from a certain position of the side surface 131a1 of the upwardly protruding wall mount guide 113a, for example, a position at about 50% of the entire length of the side surface, to an upper end, only a portion of the side surface 113a1 of the wall mount guide 113a makes contact with one side of the wall mount plate 200.

The distance d2, for example, about 270 mm, which may be changed corresponding to the size of the display apparatus, from a side surface 113a2 of the upwardly protruding wall mount guide 113a to the side frame 140 may be longer than the distance d1, for example, about 250 mm, which may be changed corresponding to the size of the display apparatus, from the side surface 113a2 of the upwardly protruding wall mount guide 113a to the rear cover 113. When the length of the width of the display apparatus 100 and the length of the rear cover 113 are identical, the distance d2, which is from a side surface 113a2 of the upwardly protruding wall mount guide 113a to the side frame 140, may be identical with respect to the distance d1, which is from the side surface 113a2 of the upwardly protruding wall mount guide 113a to the rear cover 113.

When a taper-treatment is performed from a certain position of the side surface 131a1 of the wall mount guide 113a, for example, a position at about 50% of the entire length of the side surface, to an upper end, the coupling of the wall mount plate 200 and the display apparatus 100 may easily be performed. In addition, in a case when a taper-treatment is performed from a certain position of the side surface 131a1 of the wall mount guide 113a, for example, a position at about 50% of the entire length of the side surface, to an upper end, the coupling of the wall mount plate 200 accommodating the magnet 250 and the display apparatus 100 may easily be performed.

The rear surface 110 of the display apparatus 100 having the rear cover 113 provided with the wall amount guide 113a may be coupled to the wall mount plate 200 by use of magnetic force. The rear surface 110 of the display apparatus 100 having the rear cover 113 provided with the wall amount guide 113a may be coupled to the wall mount plate 200 by use of the magnet accommodated at the wall mount plate 200. The rear surface 110 of the display apparatus 100 having the rear cover 113 provided with the wall amount guide 113a may be coupled to the wall mount plate 200 fixed onto the wall 300 and provided with magnetic force.

The thickness of the display apparatus 100 having the rear cover 113 provided with the wall mount guide 113a is provided to be thicker than the thickness of the display apparatus 100 excluding the rear cover 113. The thickness of the display apparatus 100 excluding the rear cover 113 may be about 50% of the thickness of the display apparatus 100 including the rear cover 113. The thickness of the display apparatus 100 excluding the rear cover 113 may be greater than about 40% or smaller than about 70% of the thickness of the display apparatus 100 including the rear cover 113.

The thickness of the display apparatus 100 excluding the rear cover 113 provided with the wall mount guide 113a may be identical to the thickness of the display apparatus 100. The coupled thickness of the bottom chassis 110, excluding the rear cover 113, and the top chassis (not shown) may be identical to the thickness of the display apparatus 100. For example, the thickness of the display apparatus 100 excluding the rear cover 113 may be about 5.4 mm. The thickness of the display apparatus 100 excluding the rear cover 113 may be greater than about 4.8 mm and less than about 6.0 mm. The thickness of the display apparatus 100 excluding the rear cover 113 may be greater than about 4.5 mm and less than about 6.5 mm. In addition, the thickness of the display apparatus 100 excluding the rear cover 113 may be greater than about 5.0 mm and less than about 6.0 mm. The thickness of the display apparatus 100 excluding the rear cover 113 may be changed by corresponding to the slimization of the display apparatus 100, and such may be easily appreciated by those skilled in the art.

The rear cover 113 may not be coupled to the rear surface of the display apparatus 100 by corresponding to the reduced thickness of the display apparatus 100. The thickness of the display apparatus 100 may be even. The thickness of the display apparatus 100 may be greater than about 4.8 mm and less than about 6.0 mm. The thickness of the display apparatus 100 may be greater than about 4.5 mm and less than about 6.5 mm. In addition, the thickness of the display apparatus 100 may be greater than about 5.0 mm and less than about 6.0 mm.

The rear surface of the display apparatus 100 may be flat. The curvature of the rear surface of the bottom chassis 110 may be identical to the curvature of the display panel 170.

The curvature of the rear surface of the display apparatus 100 and the curvature of the display panel 170 may be reciprocally different. For example, the curvature of the display panel 170 may be greater or identical with respect to the curvature of the rear surface of the display apparatus 100. In addition, the curvature of the display panel 170 may be less than the curvature of the rear surface of the display apparatus 100.

The rear cover 113 provided with the wall mount guide 113a of FIG. 7 is identical, for example, to the rear cover 112 of FIG. 2, and this the overlapping descriptions will be omitted.

Figure 8:
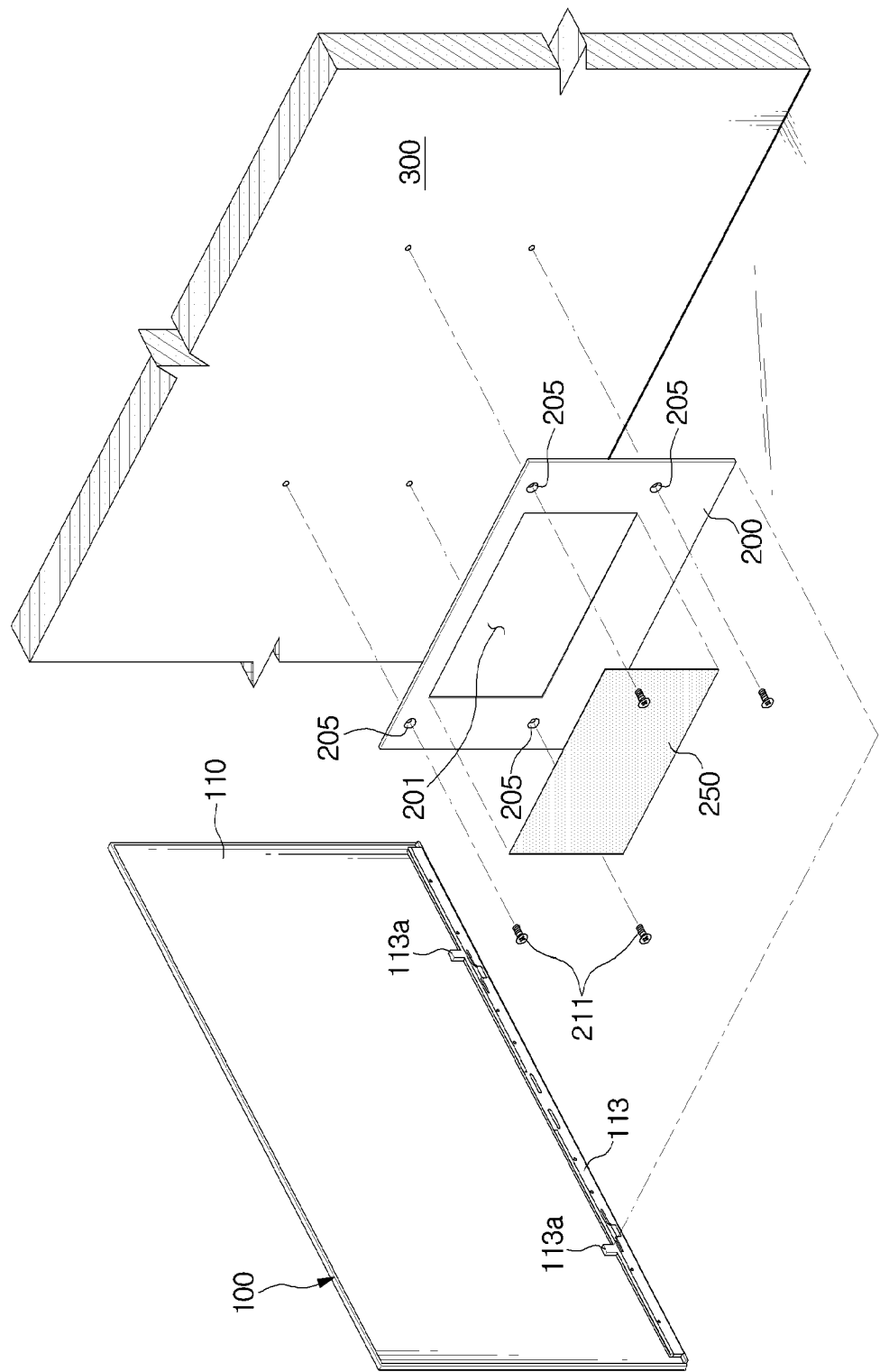
FIG. 8 is a schematic exploded perspective view illustrating an example display apparatus, magnet, and wall mount plate.

FIG. 8 is a schematic exploded perspective view illustrating an example display apparatus, the magnet, and the wall mount plate.

Referring to FIG. 8, the wall mount plate 200 accommodating the magnet 250 is positioned at a front of the wall 300. The display apparatus 100 having the rear cover 113 provided with the wall mount guide 113a and configured to be fixed by use of the contact of the rear cover 113 provided with the wall mount guide 113a and the wall mount plate 200 is illustrated.

The display apparatus 100 on FIG. 8 is similar, for example, to the display apparatus 100 on FIG. 3, with the exception of the rear covers, and thus the overlapped descriptions will be omitted. The rear cover 113 having the wall mount guide 113a on FIG. 8 is identical to the rear cover 113 having the wall mount guide 113a on FIG. 7, and thus overlapped descriptions will be omitted.

The wall mount plate 200 and the magnet 250 on FIG. 8 are identical to the wall mount plate 200 and the magnet 250 on FIG. 3 to FIG. 4, and thus overlapped descriptions will be omitted.

The other wall mount plates 200a to 200c described on FIG. 6A to FIG. 6C may be applied in the identical manner as the wall mount plate 200 on FIG. 8, and such may be easily appreciated by those skilled in the art.

Figure 9:
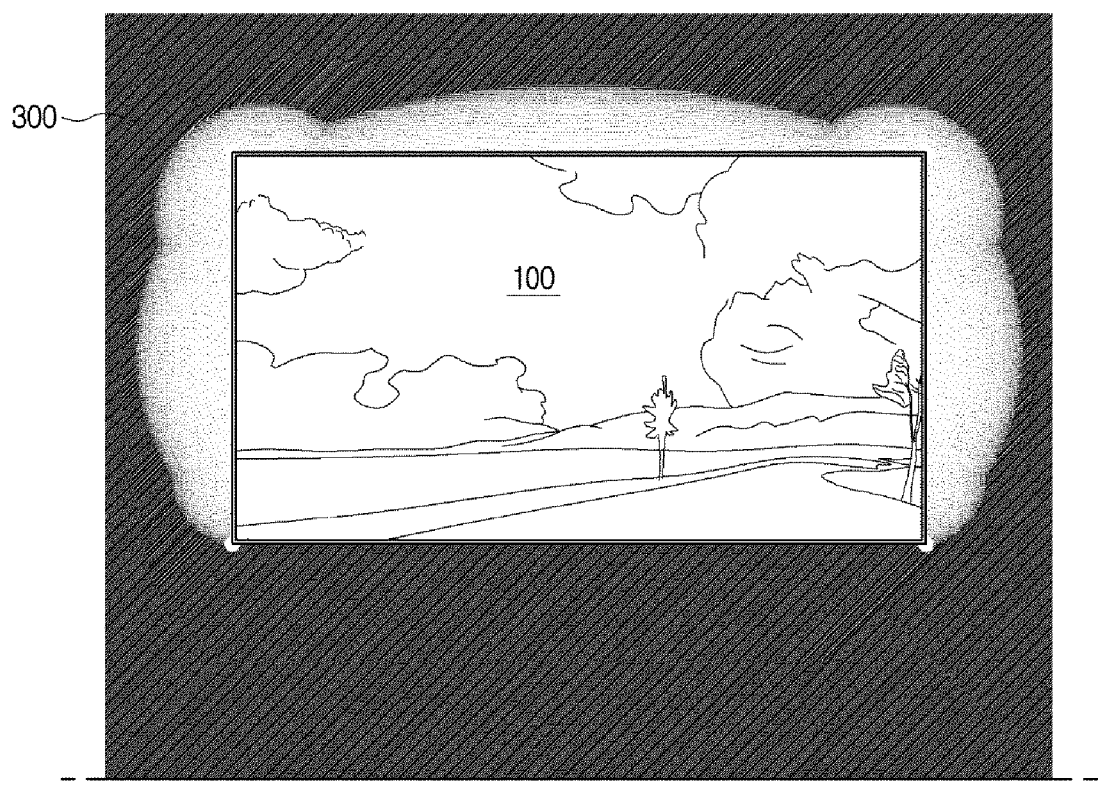
FIG. 9 is a schematic frontal view illustrating an example display apparatus fixed onto a wall.

FIG. 9 is a schematic frontal view illustrating an example display apparatus fixed onto a wall.

Figure 10:
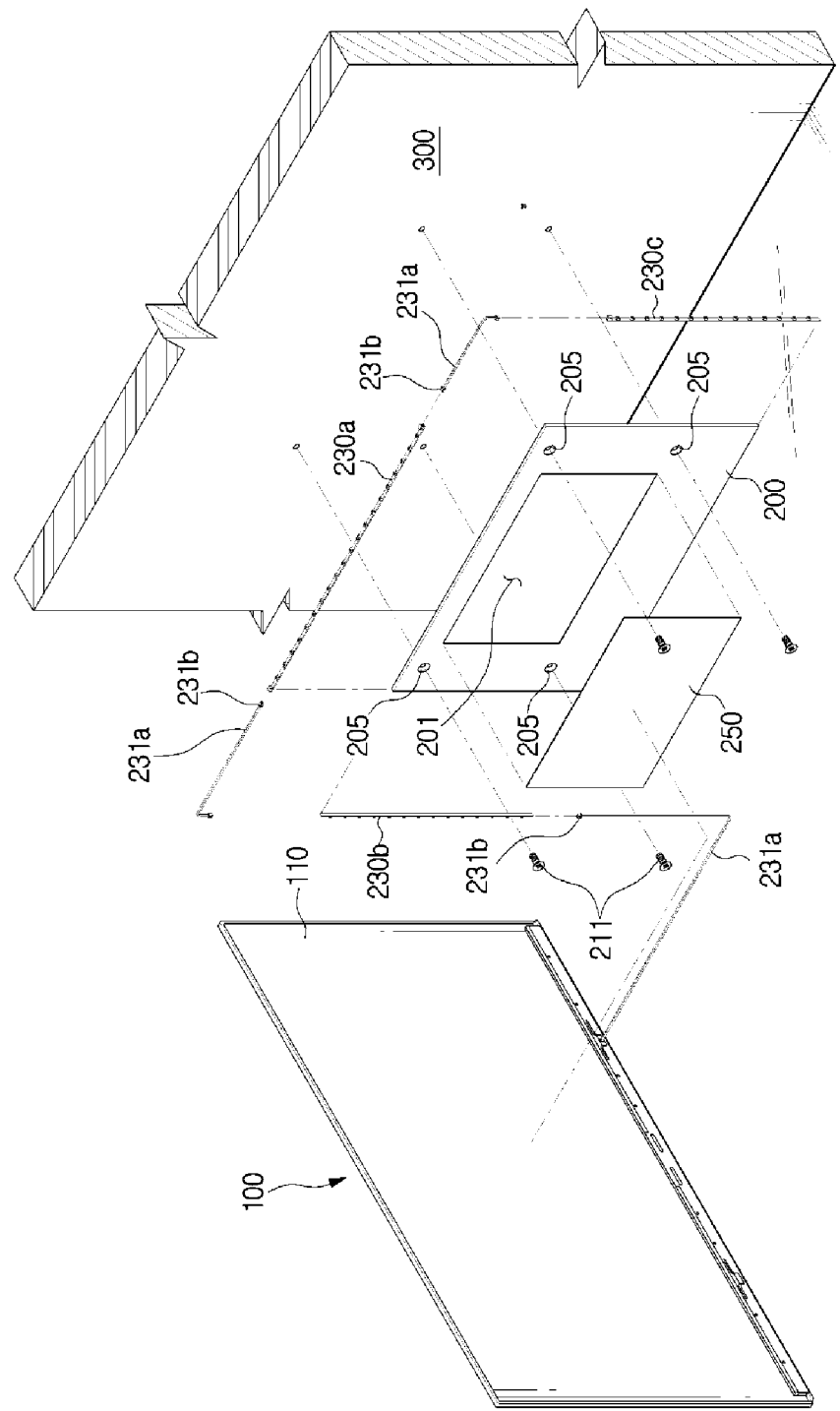
FIG. 10 is a schematic exploded perspective view illustrating an example display apparatus, magnet, light-emitting unit, and wall mount plate.

FIG. 10 is a schematic exploded perspective view illustrating an example display apparatus, magnet, light-emitting unit, and wall mount plate.

Figure 11:
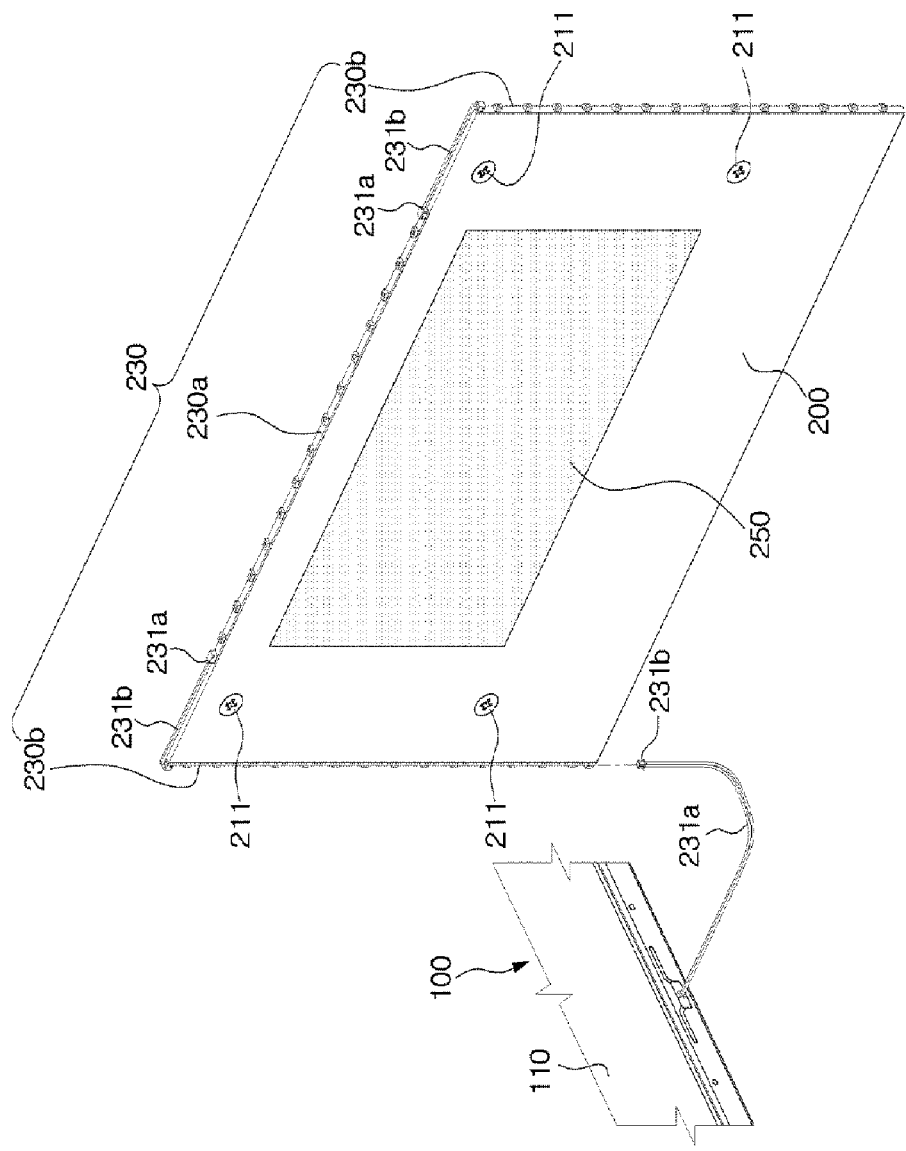
FIG. 11 is a schematic perspective view illustrating an example connection of the display apparatus, the light-emitting unit, and the wall mount plate.

FIG. 11 is a schematic perspective view illustrating an example connection of the display apparatus, the light-emitting unit, and the wall mount plate.

Referring to FIG. 9 to FIG. 11, light may be emitted from in between the display apparatus 100 and the wall 300. The light may be emitted through a light radiating unit 230 electrically connected to the display apparatus 100.

The wall mount plate 200 accommodating the magnet 250 and provided to fix the light radiating unit 230 to a side surface may be fixed onto a front of the wall 300. The display apparatus 100 may be fixed while making contact with the wall mount plate 200.

One light radiating unit 230 may be fixed onto a side surface of the wall mount plate 200. The plurality of light radiating units 230 may be fixed onto a side surface of the wall mount plate 200. In addition, the light radiating unit 230 may be fixed onto an each side of the wall mount plate 200. The light radiating unit 230 may be fixed onto the wall mount plate 200 by use of one of a screw coupling, a rivet, an adhesive tape, and an adhesion.

A control unit (not shown) of the display apparatus 100 may supply power to the light radiating unit 230, for example, by use of a cable 231a. The light radiating units 230a to 230c positioned at side surfaces of the wall mount plate 200 may be electrically connected to the cable 231a through a connector 231b.

In FIG. 10 and FIG. 11, the cable 231a, and the connector 231b, the wall mount plate 200, the magnet 250, and the display apparatus 100 are identical to the wall mount plate 200, the magnet 250, and the display apparatus 100 on FIG. 3 to FIG. 4B, and thus overlapped descriptions will be omitted.

Although several examples have been shown and described, it will be appreciated by those skilled in the art that changes may be made in these examples without departing from the principles and spirit of the disclosure, the scope of which is defined in the claims and their equivalents.

What is claimed is:

1. A wall mount plate, comprising:
a rear surface configured to make contact with a wall; and
a recess provided in the wall mount plate, the recess accommodating a magnet, wherein the magnet has a thickness equal to a depth of the recess such that the magnet does not protrude beyond the surface of the wall mount plate,
wherein the wall mount plate is configured to contact a bottom chassis of a display apparatus provided at a front of the wall mount plate by a magnetic force of the magnet.

2. The wall mount plate of claim 1, wherein:
a lower end of the wall mount plate is configured to make contact with an upper end of a rear cover of the display apparatus.

3. The wall mount plate of claim 1, wherein:
the recess is provided at a position closer to the upper end of the wall mount plate.

4. The wall mount plate of claim 1, wherein:
a central point of the recess and a central point of the wall mount plate are different from each other.

5. The wall mount plate of claim 1, wherein:
a depth of the recess is less than a thickness of the wall mount plate.

6. The wall mount plate of claim 1, further comprising:
a hole configured to receive a coupling member,
wherein the wall mount plate is configured to be fixed onto the wall by the coupling member passing through the hole.

7. The wall mount plate of claim 6, wherein:
one of a virtual line, which is provided to connect corner points of the recess that are facing each other, and a virtual line, which is provided to connect corner points of the wall mount plate that are facing each other, passes through the hole.

8. The wall mount plate of claim 6, wherein:
the recess and the hole are positioned to be spaced apart.

9. The wall mount plate of claim 1, wherein:
the recess is provided with one or more recesses.

10. The wall mount plate of claim 1, wherein:
the shape of the recess comprises one of a polygonal shape, a circular shape, an oval shape, or a freely formed shape.

11. The wall mount plate of claim 1, wherein:
a lower end of the wall mount plate is configured to make contact with an upper end of the rear cover of the display apparatus, said rear cover including a wall mount guide protruding in an upward direction.

12. The wall mount plate of claim 11, wherein:
one side of the wall mount plate is configured to make contact with a side surface of the wall mount guide.

13. The wall mount plate of claim 11, further comprising:
light radiating circuitry configured to emit light, and
the light radiating circuitry being coupled to a side surface of the wall mount plate.

14. The wall mount plate of claim 13, wherein:
the light radiating circuitry is supplied with power from the display apparatus.

15. A wall mount plate, comprising:
a rear surface configured to make contact with a wall by a coupling member; and
a front surface provided with a recess to accommodate a magnet, said front surface configured to make contact with a bottom chassis of a display apparatus at a front of the wall mount plate by a magnetic force of the magnet,
wherein the magnet has a thickness substantially equal to a depth of the recess such that the magnet does not protrude beyond the surface of the wall mount plate.

16. A display apparatus configured to be fixed onto a wall, the display apparatus comprising:
a display panel configured to display contents; and
a bottom chassis facing a wall when the display apparatus is mounted on the wall,
wherein the bottom chassis is configured to make contact by magnetic force with a wall mount plate fixed onto the wall,
wherein the wall mount plate includes a recess provided in the wall mount plate, the recess accommodating a magnet, wherein the magnet has a thickness substantially equal to a depth of the recess such that the magnet does not protrude beyond the surface of the wall mount plate.

17. The display apparatus of claim 16, further comprising:
a rear cover disposed at a rear of the bottom chassis so that the display apparatus makes contact with the wall mount plate when the display apparatus is mounted on the wall.

18. The display apparatus of claim 17, wherein:
the rear cover is configured to make contact with a lower end of the wall mount plate.

19. The display apparatus of claim 16, further comprising:
at least one wall mount guide provided at a rear surface of the bottom chassis to guide a side surface of the wall mount plate fixed onto the wall.

20. The display apparatus of claim 16, wherein:
the display apparatus is electrically connected to the wall mount plate fixed onto the wall.

21. The wall mount plate of claim 1, wherein the wall mount plate is rigid.

22. The wall mount plate of claim 1, wherein said recess is a hole that extends through the wall plate.

* * * * *